(12) United States Patent
Yamada et al.

(10) Patent No.: US 10,014,258 B2
(45) Date of Patent: Jul. 3, 2018

(54) SILICON CARBIDE SEMICONDUCTOR DEVICE HAVING GATE ELECTRODE

(71) Applicants: Sumitomo Electric Industries, Ltd., Osaka-shi (JP); Renesas Electronics Corporation, Koutou-ku (JP)

(72) Inventors: Shunsuke Yamada, Osaka (JP); So Tanaka, Osaka (JP); Daisuke Hamajima, Osaka (JP); Shinji Kimura, Hitachinaka (JP); Masayuki Kobayashi, Hitachinaka (JP); Masaki Kijima, Hitachinaka (JP); Maki Hamada, Hitachinaka (JP)

(73) Assignees: Sumitomo Electric Industries, Ltd., Osaka-shi (JP); Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/512,916

(22) PCT Filed: Aug. 31, 2015

(86) PCT No.: PCT/JP2015/074671
§ 371 (c)(1),
(2) Date: Mar. 21, 2017

(87) PCT Pub. No.: WO2016/063630
PCT Pub. Date: Apr. 28, 2016

(65) Prior Publication Data
US 2017/0309574 A1    Oct. 26, 2017

(30) Foreign Application Priority Data

Oct. 24, 2014 (JP) ................. 2014-217534

(51) Int. Cl.
*H01L 29/66* (2006.01)
*H01L 23/532* (2006.01)
(Continued)

(52) U.S. Cl.
CPC .. *H01L 23/53295* (2013.01); *H01L 23/53223* (2013.01); *H01L 29/1608* (2013.01);
(Continued)

(58) Field of Classification Search
CPC ........... H01L 29/1608; H01L 29/66068; H01L 29/66666; H01L 29/7788; H01L 29/7827; H01L 29/78642; H01L 27/11273
See application file for complete search history.

(56) References Cited

U.S. PATENT DOCUMENTS 6,424,012 B1 *   7/2002   Kawasaki ......... G02F 1/133345
                                                          257/350
2004/0121543 A1 * 6/2004  Miyagawa ........ H01L 21/02129
                                                          438/261
(Continued)

FOREIGN PATENT DOCUMENTS

JP       S58-093324 A     6/1983
JP       H11-345964 A    12/1999
(Continued)

OTHER PUBLICATIONS

International Search Report in counterpart International Application No. PCT/JP2015/074671, dated Dec. 1, 2015.
(Continued)

*Primary Examiner* — Hoai V Pham
(74) *Attorney, Agent, or Firm* — Venable LLP; Michael A. Sartori; Kerri M. Patterson

(57) ABSTRACT

The gate electrode is provided on the gate insulating film. The interlayer insulating film is provided to cover the gate electrode. The interlayer insulating film includes a first insulating film which is in contact with the gate electrode, contains silicon atoms, and contains neither phosphorus atoms nor boron atoms, a second insulating film which is provided on the first insulating film and contains silicon
(Continued)

atoms and at least one of phosphorus atoms and boron atoms, and a third insulating film which contains silicon atoms and contains neither phosphorus atoms nor boron atoms. The second insulating film has a first surface which is in contact with the first insulating film, a second surface opposite to the first surface, and a third surface which connects the first surface and the second surface. The third insulating film is in contact with at least one of the second surface and the third surface.

15 Claims, 12 Drawing Sheets

(51) Int. Cl.
    *H01L 29/16*     (2006.01)
    *H01L 29/78*     (2006.01)
    *H01L 29/45*     (2006.01)

(52) U.S. Cl.
    CPC ........ *H01L 29/45* (2013.01); *H01L 29/66068* (2013.01); *H01L 29/78* (2013.01)

(56) References Cited

U.S. PATENT DOCUMENTS

| | | | |
|---|---|---|---|
| 2007/0210454 A1* | 9/2007 | Chou | H01L 21/76802 257/758 |
| 2008/0315211 A1 | 12/2008 | Ichikawa et al. | |
| 2010/0219451 A1* | 9/2010 | Chow | H01L 29/0847 257/192 |
| 2015/0372094 A1 | 12/2015 | Horii et al. | |

FOREIGN PATENT DOCUMENTS

| | | |
|---|---|---|
| JP | 2009-004573 A | 1/2009 |
| JP | 2010-272785 A | 12/2010 |
| JP | 2010-272785 A | 12/2012 |
| JP | 2014-175471 A | 9/2014 |

OTHER PUBLICATIONS

Okamoto et al., "Reduction of instability in Vth of 4H-SiC C-face MOSFETs," Proceedings of the 59th Spring Meeting of the Japan Society of Applied Physics and Related Societies, 2012, Waseda University, p. 15-309.

\* cited by examiner

SILICON CARBIDE SEMICONDUCTOR DEVICE HAVING GATE ELECTRODE

TECHNICAL FIELD

The present disclosure relates to a silicon carbide semiconductor device.

BACKGROUND ART

In order to allow a semiconductor device to be high in breakdown voltage and low in loss and to be used in a high-temperature environment, silicon carbide has recently increasingly been adopted as a material forming a semiconductor device. For example, Mitsuo Okamoto et al., "Reduction of Instability in Vth of 4H—SiC Carbon Face MOSFETs," the 59th Spring Meeting, Proceedings, The Japan Society of Applied Physics, Spring 2012, pp. 15-309 (NPD 1) has pointed out that a silicon carbide metal oxide semiconductor field effect transistor (MOSFET) suffers from fluctuation in threshold voltage due to gate bias stress. This document discloses a method of annealing a silicon carbide substrate having a gate oxide film formed thereon in a hydrogen atmosphere in order to reduce fluctuation in threshold voltage.

CITATION LIST

Non Patent Document

NPD 1: Mitsuo Okamoto et al., "Reduction of Instability in Vth of 4H—SiC Carbon Face MOSFETs," the 59th Spring Meeting, Proceedings, The Japan Society of Applied Physics, Spring 2012, pp. 15-309

SUMMARY OF INVENTION

Technical Problem

In a case of annealing in a hydrogen atmosphere, however, even though fluctuation in threshold voltage can temporarily be reduced, the effect of reducing fluctuation in threshold voltage may be lost, for example, when a substrate is exposed to a high temperature in a subsequent step of forming an ohmic electrode or the like. In other words, although fluctuation in threshold voltage is reduced at the stage of formation of a gate electrode on the substrate, fluctuation in threshold voltage may not be reduced at the stage of a final device.

An object of the present disclosure is to provide a silicon carbide semiconductor device in which fluctuation in threshold voltage can be reduced.

Solution to Problem

A silicon carbide semiconductor device according to one aspect of the present disclosure includes a silicon carbide substrate, a gate insulating film, a gate electrode, and an interlayer insulating film. The silicon carbide substrate has a main surface. The gate insulating film is provided on the main surface of the silicon carbide substrate. The gate electrode is provided on the gate insulating film. The interlayer insulating film is provided to cover the gate electrode. The interlayer insulating film includes a first insulating film which is in contact with the gate electrode, contains silicon atoms, and contains neither phosphorus atoms nor boron atoms, a second insulating film which is provided on the first insulating film and contains silicon atoms and at least one of phosphorus atoms and boron atoms, and a third insulating film which contains silicon atoms and contains neither phosphorus atoms nor boron atoms. The second insulating film has a first surface which is in contact with the first insulating film, a second surface opposite to the first surface, and a third surface which connects the first surface and the second surface. The third insulating film is in contact with at least one of the second surface and the third surface.

Advantageous Effects of Invention

According to the above aspect, a silicon carbide semiconductor device in which fluctuation in threshold voltage can be reduced can be provided.

DESCRIPTION OF EMBODIMENTS

Figure 1:
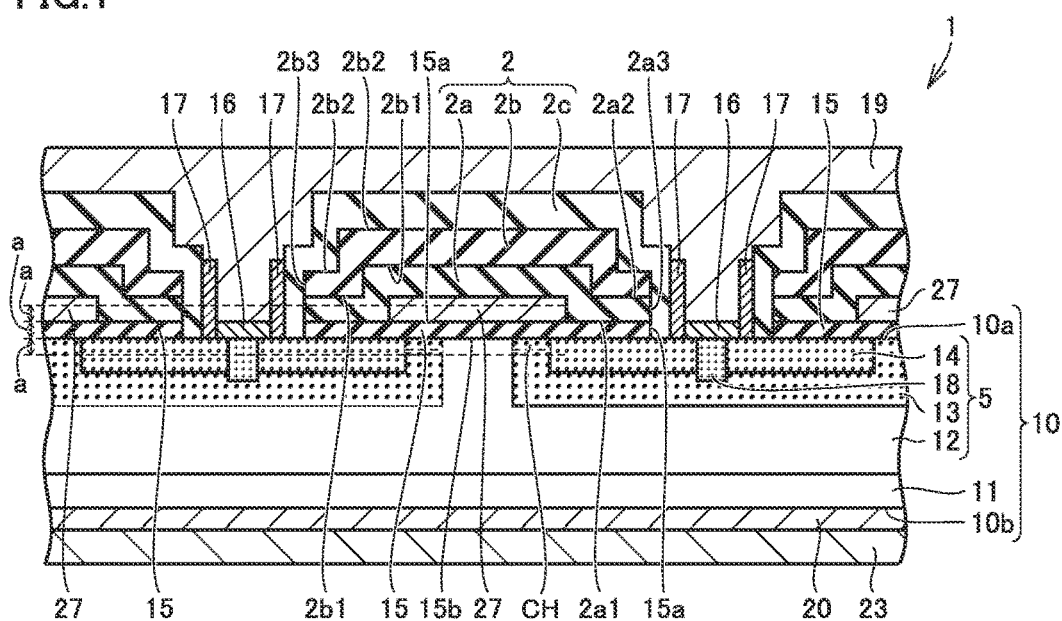
FIG. 1 is a schematic cross sectional view showing a structure of a silicon carbide semiconductor device according to a first embodiment.

First, embodiments will be described in list form.

(1) A silicon carbide semiconductor device 1 according to one aspect of the present disclosure includes a silicon carbide substrate 10, a gate insulating film 15, a gate electrode 27, and an interlayer insulating film 2. Silicon carbide substrate 10 has a main surface 10a. Gate insulating film 15 is provided on main surface 10a of silicon carbide substrate 10. Gate electrode 27 is provided on gate insulating film 15. Interlayer insulating film 2 is provided to cover gate electrode 27. Interlayer insulating film 2 includes a first insulating film 2a which is in contact with gate electrode 27, contains silicon atoms, and contains neither phosphorus atoms nor boron atoms, a second insulating film 2b which is provided on first insulating film 2a and contains silicon atoms and at least one of phosphorus atoms and boron atoms, and a third insulating film 2c which contains silicon atoms and contains neither phosphorus atoms nor boron atoms. Second insulating film 2b has a first surface 2b1 which is in contact with first insulating film 2a, a second surface 2b2 opposite to first surface 2b1, and a third surface 2b3 which connects first surface 2b1 and second surface 2b2. Third insulating film 2c is in contact with at least one of second surface 2b2 and third surface 2b3.

The inventors have conducted diligent studies on approaches for suppressing fluctuation in threshold voltage due to gate bias stress, and obtained the findings as follows.

In a process for manufacturing a silicon carbide semiconductor device, metal impurities of alkali metals such as sodium (Na) and potassium (K) which are present in an atmosphere adhere to a surface of an interlayer insulating film provided on a gate electrode. The metal impurities such as sodium enter the gate electrode through the surface of the interlayer insulating film due to heat treatment in the step of forming a source electrode and a step subsequent to the step of forming a source electrode, and diffuse to the vicinity of a gate insulating film. The metal impurities such as sodium supply charges during an operation of a MOSFET, and consequently a threshold voltage lowers and a current tends to flow. As a result, it is expected that the threshold voltage fluctuates before and after gate bias stress.

The inventors have initially examined adopting an insulating film containing phosphorus or boron, such as phosphosilicate glass (PSG) or borosilicate glass (BSG), for example, as a portion of an interlayer insulating film. Phosphorus or boron has a high affinity for alkali metals such as sodium, and thus metal impurities such as sodium can be trapped in the insulating film containing phosphorus or boron. Accordingly, diffusion of the metal impurities adhering to the surface of the interlayer insulating film to the vicinity of the gate insulating film can be suppressed. As a result, fluctuation in threshold voltage can be reduced.

On the other hand, when the insulating film containing phosphorus or boron is adopted as a portion of the interlayer insulating film, there is a concern that a contact hole at which a source electrode is to be formed may be contaminated by phosphorus or boron or a compound containing phosphorus or boron, which may increase a contact resistance between the source electrode and a silicon carbide substrate. More specifically, there can be expected a case where, during dry etching or wet etching, phosphorus or boron is eluted or evaporated from the insulating film containing phosphorus or boron, and contaminates a surface of the silicon carbide substrate exposed at a contact hole portion. Alternatively, there can be expected a case where, when film formation, plasma treatment, or heat treatment is performed in a step after the above etching, phosphorus or boron is evaporated, sputtered, or thermally diffused from the insulating film containing phosphorus or boron, and contaminates the surface of the silicon carbide substrate or the inside of a crystal of the silicon carbide substrate. It is also conceivable that a combination of the above two cases may occur. As a result of diligent studies, the inventors have decided to constitute the interlayer insulating film by a first insulating film which contains silicon atoms and contains neither phosphorus atoms nor boron atoms, a second insulating film which is provided on the first insulating film and contains silicon atoms and at least one of phosphorus atoms and boron atoms, and a third insulating film which contains silicon atoms and contains neither phosphorus atoms nor boron atoms. Further, the inventors have decided to provide the third insulating film to be in contact with at least one of an upper surface and a side surface of the second insulating film. Thereby, contamination of a contact hole by phosphorus atoms or boron atoms contained in the second insulating film can be suppressed. As a result, an increase in the contact resistance between the source electrode and the silicon carbide substrate can be suppressed.

According to silicon carbide semiconductor device 1 according to (1) described above, interlayer insulating film 2 includes first insulating film 2a which is in contact with gate electrode 27, contains silicon atoms, and contains neither phosphorus atoms nor boron atoms, second insulating film 2b which is provided on first insulating film 2a and contains silicon atoms and at least one of phosphorus atoms and boron atoms, and third insulating film 2c which contains silicon atoms and contains neither phosphorus atoms nor boron atoms. Second insulating film 2b has first surface 2b1 which is in contact with first insulating film 2a, second surface 2b2 opposite to first surface 2b1, and third surface 2b3 which connects first surface 2b1 and second surface 2b2. Third insulating film 2c is in contact with at least one of second surface 2b2 and third surface 2b3. Thereby, fluctuation in the threshold voltage of silicon carbide semiconductor device 1 can be reduced. Further, an increase in the contact resistance between the source electrode and silicon carbide substrate 10 can be suppressed.

(2) Preferably, in silicon carbide semiconductor device 1 according to (1) described above, second insulating film 2b is confined within a space formed by first insulating film 2a and third insulating film 2c. Thereby, contamination of a contact hole by phosphorus atoms or boron atoms contained in second insulating film 2b can be suppressed. As a result, an increase in the contact resistance between the source electrode and silicon carbide substrate 10 can be effectively suppressed.

(3) Preferably, in silicon carbide semiconductor device 1 according to (1) described above, third insulating film 2c is in contact with second surface 2b2. Thereby, diffusion of sodium from the second surface 2b2 side toward gate insulating film 15 can be suppressed.

(4) Preferably, in silicon carbide semiconductor device 1 according to (1) described above, first insulating film 2a has a fourth surface 2a1 which is in contact with gate insulating film 15, a fifth surface 2a2 opposite to fourth surface 2a1, and a sixth surface 2a3 which connects fourth surface 2a1 and fifth surface 2a2. Third insulating film 2c is in contact with third surface 2b3 and sixth surface 2a3. Thereby, diffusion of sodium from the third surface 2b3 side and the sixth surface 2a3 side toward gate insulating film 15 can be suppressed.

(5) Preferably, in silicon carbide semiconductor device 1 according to (1) described above, second insulating film 2b is in contact with main surface 10a at third surface 2b3. Third insulating film 2c is in contact with second surface 2b2, and is distant from first insulating film 2a by second insulating film 2b. Thereby, diffusion of sodium from the second surface 2b2 side toward gate insulating film 15 can be suppressed.

(6) Preferably, in silicon carbide semiconductor device 1 according to any of (1) to (5) described above, first insulating film 2a includes any of $SiO_2$, SiN, and SiON. Thereby, insulating property of interlayer insulating film 2 can be effectively improved.

(7) Preferably, in silicon carbide semiconductor device 1 according to any of (1) to (6) described above, second insulating film 2b includes any of PSG, BSG, and borophosphosilicate glass (BPSG). PSG is $SiO_2$ having $P_2O_5$ or $P_2O_3$, which is an oxide film of phosphorus (P), added thereto. BSG is $SiO_2$ having $B_2O_5$, which is an oxide film of boron (B), added thereto. BPSG is $SiO_2$ having $B_2O_5$, which is an oxide film of boron (B), and $P_2O_5$ or $P_2O_3$, which is an oxide film of phosphorus (P), added thereto. In order to form PSG, BSG, and BPSG films, a hydride represented by silane ($SiH_4$) or disilane ($Si_2H_6$) may be used, or an organic raw material represented by tetraethyl orthosilicate (TEOS) may be used. Thereby, sodium can be effectively trapped by second insulating film 2b.

(8) Preferably, in silicon carbide semiconductor device 1 according to any of (1) to (7) described above, third insulating film 2c includes any of $SiO_2$, SiN, and SiON. Thereby, insulating property of interlayer insulating film 2 can be effectively improved.

(9) Preferably, in silicon carbide semiconductor device 1 according to any of (1) to (8) described above, a maximum value of a concentration of sodium atoms in gate insulating film 15 is less than or equal to $1 \times 10^{16}$ atoms/$cm^3$. Thereby, fluctuation in the threshold voltage of silicon carbide semiconductor device 1 can be effectively reduced.

(10) Preferably, in silicon carbide semiconductor device 1 according to any of (1) to (9) described above, a maximum value of a concentration of sodium atoms in second insulating film 2b is higher than a maximum value of a concentration of sodium atoms in first insulating film 2a. Diffusion of sodium into gate insulating film 15 can be suppressed by trapping a large amount of sodium atoms by second insulating film 2b.

(11) Preferably, in silicon carbide semiconductor device 1 according to any of (1) to (10) described above, a maximum value of a concentration of sodium atoms in second insulating film 2b is higher than a maximum value of a concentration of sodium atoms in gate insulating film 15. Diffusion of sodium into gate insulating film 15 can be suppressed by trapping a large amount of sodium atoms by second insulating film 2b.

(12) Preferably, silicon carbide semiconductor device 1 according to any of (1) to (11) described above further includes a source electrode 16 which is in contact with silicon carbide substrate 10 and contains aluminum, and a barrier layer 17 provided between source electrode 16 and interlayer insulating film 2. Thereby, diffusion of aluminum contained in source electrode 16 into interlayer insulating film 2 can be suppressed.

(13) Preferably, in silicon carbide semiconductor device 1 according to (12) described above, barrier layer 17 includes TiN. Thereby, diffusion of aluminum contained in source electrode 16 into interlayer insulating film 2 can be effectively suppressed.

(14) Preferably, in silicon carbide semiconductor device 1 according to (12) or (13) described above, source electrode 16 includes TiAlSi. Thereby, a contact resistance between source electrode 16 and silicon carbide substrate 10 can be reduced.

(15) Preferably, in silicon carbide semiconductor device 1 according to any of (1) to (14) described above, first insulating film 2a and second insulating film 2b are repeatedly stacked in interlayer insulating film 2. Thereby, diffusion of sodium into gate insulating film 15 can be effectively suppressed. As a result, fluctuation in the threshold voltage of silicon carbide semiconductor device 1 can be effectively reduced.

(16) Preferably, in silicon carbide semiconductor device 1 according to any of (1) to (15) described above, in a first stress test in which a gate voltage of −5 V is applied to gate electrode 27 for 100 hours at a temperature of 175° C., an absolute value of a difference between a first threshold voltage and a second threshold voltage is less than or equal to 0.5 V, with a threshold voltage before the first stress test being defined as the first threshold voltage and a threshold voltage after the first stress test being defined as the second threshold voltage. Thereby, fluctuation in the threshold voltage of silicon carbide semiconductor device 1 can be effectively reduced.

Details of Embodiments

Hereinafter, embodiments will be described with reference to the drawings. It should be noted that, in the drawings below, identical or corresponding parts will be designated by the same reference numerals, and the description thereof will not be repeated. Regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "−" (bar) above a numeral, but is indicated by putting the negative sign before the numeral in the present specification.

First Embodiment

First, a configuration of a MOSFET 1 as a silicon carbide semiconductor device according to a first embodiment will be described.

As shown in FIG. 1, MOSFET 1 according to the first embodiment mainly has silicon carbide substrate 10, gate electrode 27, gate insulating film 15, interlayer insulating film 2, barrier layer 17, source electrode 16, a front surface protecting electrode 19, a drain electrode 20, and a back surface protecting electrode 23. Silicon carbide substrate 10 has first main surface 10a, and a second main surface 10b opposite to first main surface 10a. Silicon carbide substrate 10 mainly includes a silicon carbide single crystal substrate 11 constituting second main surface 10b, and a silicon carbide epitaxial layer 5 provided on silicon carbide single crystal substrate 11 and constituting first main surface 10a.

Silicon carbide single crystal substrate 11 is made of, for example, a hexagonal silicon carbide single crystal having a polytype of 4H. The maximum diameter of first main surface 10a of silicon carbide substrate 10 is larger than 100 mm, and is preferably more than or equal to 150 mm, and more preferably more than or equal to 200 mm. First main surface 10a of silicon carbide substrate 10 is, for example, a {0001} plane, or a plane having an off angle of less than or equal to 8° from the {0001} plane. Specifically, first main surface 10a is, for example, a (0001) plane, or a plane having an off angle of less than or equal to about 8° from the (0001) plane, and second main surface 10b is a (000-1) plane, or a plane having an off angle of less than or equal to about 8° from the (000-1) plane. The thickness of silicon carbide substrate 10 is, for example, less than or equal to 700 μm, and is preferably more than or equal to 250 μm and less than or equal to 500 μm.

Silicon carbide epitaxial layer 5 has a drift region 12, a body region 13, a source region 14, and a contact region 18. Drift region 12 contains an n type impurity such as nitrogen, and has an n type (a first conductivity type). A concentration of the n type impurity in drift region 12 is, for example, about $5.0 \times 10^{15}$ cm$^{-3}$. Body region 13 contains a p type impurity such as aluminum or boron, for example, and has a p type (a second conductivity type). A concentration of the p type impurity contained in body region 13 is, for example, about $1 \times 10^{17}$ cm$^{-3}$.

Source region 14 contains an n type impurity such as phosphorus, for example, and has an n type. Source region 14 is formed within body region 13 to be surrounded by body region 13. A concentration of the n type impurity contained in source region 14 is higher than the concentration of the n type impurity contained in drift region 12. The concentration of the n type impurity contained in source region 14 is, for example, $1 \times 10^{20}$ cm$^{-3}$. Source region 14 is spaced apart from drift region 12 by body region 13.

Contact region 18 contains a p type impurity such as aluminum, and has a p type. Contact region 18 has side surfaces provided to be surrounded by source region 14, and a bottom surface which is in contact with body region 13. A concentration of the p type impurity contained in contact region 18 is higher than the concentration of the p type impurity contained in body region 13. The concentration of the p type impurity contained in contact region 18 is, for example, $1 \times 10^{20}$ cm$^{-3}$.

Gate insulating film 15 is provided on first main surface 10a of silicon carbide substrate 10. Gate insulating film 15 is in contact with source region 14, body region 13, and drift region 12 at first main surface 10a of silicon carbide substrate 10. Gate insulating film 15 is made of, for example, silicon dioxide. A thickness a of gate insulating film 15 is, for example, more than or equal to 40 nm and less than or equal to 60 nm. Preferably, a maximum value of a concentration of sodium atoms in gate insulating film 15 is less than or equal to $1 \times 10^{16}$ atoms/cm$^3$.

Figure 21:
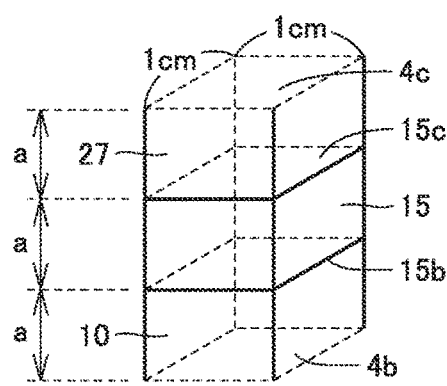
FIG. 21 is a schematic perspective view for illustrating a concentration of sodium atoms.

As shown in FIG. 1, an interface between gate insulating film 15 and gate electrode 27 is defined as a first interface 15c, and a region facing first interface 15c in an interface between gate insulating film 15 and silicon carbide substrate 10 is defined as a second interface 15b. As shown in FIGS. 1 and 21, a region sandwiched between a first virtual surface 4c and a second virtual surface 4b is defined as an interface region, first virtual surface 4c being distant from first interface 15c toward gate electrode 27 by thickness a of gate insulating film 15 along a direction of a normal to first interface 15c, second virtual surface 4b being distant from second interface 15b toward silicon carbide substrate 10 by thickness a of gate insulating film 15 along a direction of a normal to second interface 15b. A value calculated by dividing a total number of sodium contained in the interface region by an area of first interface 15c (i.e., surface density of sodium atoms) is, for example, less than or equal to $1 \times 10^{10}$ atoms/cm$^2$. As shown in FIG. 21, the surface density of sodium atoms represents the number of sodium atoms in the interface region per unit area (1 cm$^2$) of first interface 15c. In other words, the surface density of sodium atoms represents a total number of sodium atoms contained in a rectangular parallelepiped shown in FIG. 21. It should be noted that the total number of sodium atoms can be measured with a secondary ion-microprobe mass spectrometer (SIMS).

Gate electrode 27 is provided on gate insulating film 15. Gate insulating film 15 is sandwiched between gate electrode 27 and first main surface 10a of silicon carbide substrate 10. Gate electrode 27 is provided to face each of source region 14, body region 13, and drift region 12. Gate electrode 27 is made of a conductor such as polysilicon doped with an impurity or Al, for example.

Source electrode 16 is in contact with silicon carbide substrate 10. Source electrode 16 is in contact with source region 14 at first main surface 10a of silicon carbide substrate 10. Preferably, source electrode 16 is in contact with both source region 14 and contact region 18 at first main surface 10a. Source electrode 16 contains aluminum, for example, and preferably includes TiAlSi. Source electrode 16 is in ohmic contact with source region 14. Preferably, source electrode 16 is in ohmic contact with both source region 14 and contact region 18. Front surface protecting electrode 19 contains a conductor such as aluminum, for example, and is in contact with source electrode 16. Front surface protecting electrode 19 is electrically connected with source region 14 via source electrode 16.

Interlayer insulating film 2 is provided to cover gate electrode 27. Interlayer insulating film 2 includes first insulating film 2a, second insulating film 2b, and third insulating film 2c. First insulating film 2a is in contact with gate electrode 27. Gate electrode 27 is sandwiched between first insulating film 2a and gate insulating film 15. First insulating film 2a is made of a material which contains silicon atoms and contains neither phosphorus atoms nor boron atoms. Preferably, first insulating film 2a includes any of SiO$_2$, SiN, and SiON. First insulating film 2a has fourth surface 2a1 which is in contact with gate insulating film 15, fifth surface 2a2 opposite to fourth surface 2a1, and sixth surface 2a3 which connects fourth surface 2a1 and fifth surface 2a2. Fourth surface 2a1 is, for example, a lower surface of first insulating film 2a. Fifth surface 2a2 is, for example, an upper surface of first insulating film 2a. Sixth surface 2a3 is, for example, a side surface of first insulating film 2a. Fourth surface 2a1 of first insulating film 2a may be in contact with gate insulating film 15.

Second insulating film 2b is provided on first insulating film 2a. Second insulating film 2b is made of a material which contains silicon atoms and at least one of phosphorus atoms and boron atoms. That is, second insulating film 2b may contain silicon atoms and phosphorus atoms, may contain silicon atoms and boron atoms, or may contain silicon atoms, phosphorus atoms, and boron atoms. Preferably, second insulating film 2b includes any of PSG, BSG, and BPSG. Preferably, a concentration of the phosphorus atoms contained in second insulating film 2b is more than or equal to 2 atom % and less than or equal to 20 atom %. A typical value of the concentration of the phosphorus atoms contained in second insulating film 2b is 7.5 atom %. Preferably, a concentration of the boron atoms contained in second insulating film 2b is more than or equal to 1 atom % and less than or equal to 10 atom %. A typical value of the concentration of the boron atoms contained in second insulating film 2b is 4 atom %. Second insulating film 2b has first surface 2b1 which is in contact with first insulating film 2a, second surface 2b2 opposite to first surface 2b1, and third surface 2b3 which connects first surface 2b1 and the second surface 2b2. First surface 2b1 is a boundary surface between first insulating film 2a and second insulating film 2b. First surface 2b1 is, for example, a lower surface of second insulating film 2b. Second surface 2b2 is, for example, an upper surface of second insulating film 2b. Third surface 2b3 is, for example, a side surface of second insulating film 2b.

As described later, although sodium atoms are not contained in the inside of first insulating film 2a and second insulating film 2b during formation of first insulating film 2a and second insulating film 2b, sodium atoms may be contained in the inside of first insulating film 2a and second insulating film 2b after completion of manufacturing of MOSFET 1. After completion of manufacturing of MOSFET 1, a maximum value of a concentration of sodium atoms in second insulating film 2b may be higher than a maximum value of a concentration of sodium atoms in first insulating film 2a. After completion of manufacturing of MOSFET 1, the maximum value of the concentration of sodium atoms in second insulating film 2b may be higher than the maximum value of the concentration of sodium atoms in gate insulating film 15.

Third insulating film 2c is made of a material which contains silicon atoms and contains neither phosphorus atoms nor boron atoms. Preferably, third insulating film 2c includes any of $SiO_2$, SiN, and SiON. Third insulating film 2c is in contact with at least one of second surface 2b2 of second insulating film 2b and third surface 2b3 of second insulating film 2b. Preferably, third insulating film 2c is in contact with both second surface 2b2 and third surface 2b3. In the present embodiment, third insulating film 2c is in contact with both second surface 2b2 and third surface 2b3 of second insulating film 2b, and is in contact with sixth surface 2a3 of first insulating film 2a. Third insulating film 2c may be or may not be in contact with a side surface 15a of gate insulating film 15. Third insulating film 2c is in contact with source region 14 at first main surface 10a. Second insulating film 2b is confined within a space formed by first insulating film 2a and third insulating film 2c. That is, both second surface 2b2 and third surface 2b3 of second insulating film 2b are entirely in contact with third insulating film 2c, and first surface 2b1 of second insulating film 2b is entirely in contact with first insulating film 2a.

Barrier layer 17 is provided between source electrode 16 and interlayer insulating film 2. Preferably, barrier layer 17 includes TiN. Barrier layer 17 is in contact with first main surface 10a of silicon carbide substrate 10. Preferably, barrier layer 17 is in contact with a side surface of third insulating film 2c of interlayer insulating film 2. Preferably, barrier layer 17 is provided to face second insulating film 2b which contains at least one of phosphorus atoms and boron atoms. Barrier layer 17 is formed to prevent phosphorus atoms or boron atoms from contaminating a contact hole. Barrier layer 17 may be sandwiched between third insulating film 2c and front surface protecting electrode 19.

Drain electrode 20 is provided to be in contact with second main surface 10b of silicon carbide substrate 10. Drain electrode 20 may be made of another material such as nickel silicide (NiSi) which can establish ohmic contact with silicon carbide single crystal substrate 11 having an n type. Drain electrode 20 is electrically connected with silicon carbide single crystal substrate 11. Back surface protecting electrode 23 is formed to be in contact with a main surface of drain electrode 20 opposite to silicon carbide single crystal substrate 11. Back surface protecting electrode 23 contains, for example, Ti, Pt, and Au.

Next, definition of a threshold voltage ($V_{th}$) of a silicon carbide semiconductor device will be described. First, a drain current (that is, a source-drain current $I_d$) is measured with a gate voltage (that is, a gate-source voltage $V_{gs}$) being varied. When the gate voltage is lower than the threshold voltage, a pn junction between body region 13 and drift region 12 located directly under gate insulating film 15 is reverse-biased and in a non-conducting state (an off state). Therefore, substantially no drain current flows between source electrode 16 (a first electrode) and drain electrode 20 (a second electrode). On the other hand, when a voltage more than or equal to the threshold voltage is applied to gate electrode 27, an inversion layer is formed in a channel region CH (see FIG. 1) around a portion of body region 13 which is in contact with gate insulating film 15. Consequently, source region 14 and drift region 12 are electrically connected to each other so that a drain current starts to flow between source electrode 16 and drain electrode 20. Namely, the threshold voltage refers to a gate voltage at which a drain current starts to flow. More specifically, the threshold voltage refers to a gate voltage at which a drain current attains to 300 μA when a voltage ($V_{ds}$) between the source and the drain is at 10 V.

Figure 16:
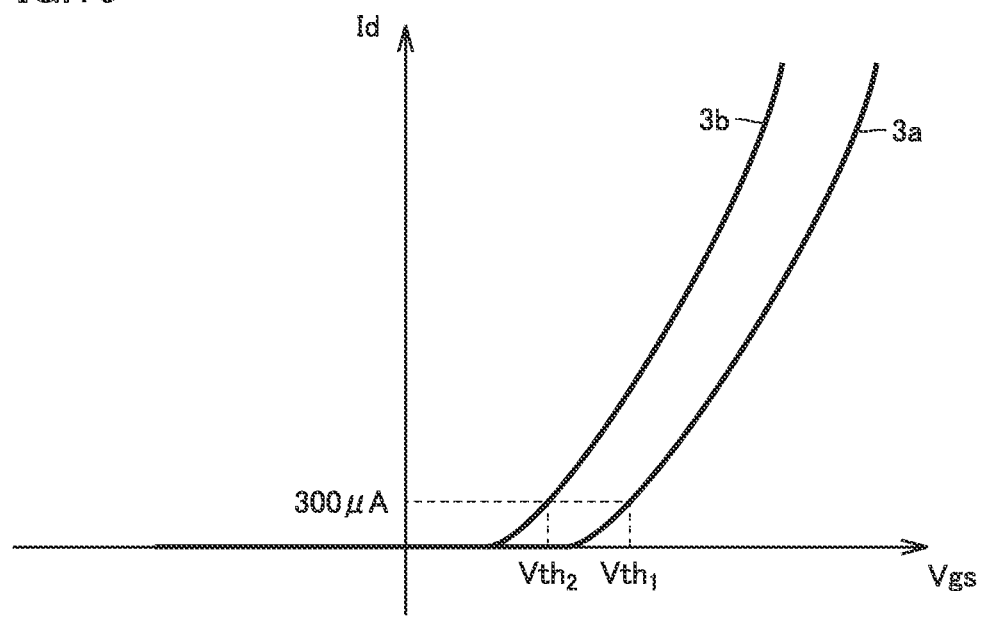
FIG. 16 is a view for illustrating a first threshold voltage and a second threshold voltage of the silicon carbide semiconductor device according to the first embodiment.

As shown in FIG. 16, fluctuation in the threshold voltage of the silicon carbide semiconductor device will be described. First, a drain current is measured with a gate voltage applied to the silicon carbide semiconductor device being varied, and relation 3a between the gate voltage and the drain current is plotted. A gate voltage at which a drain current attains to 300 μA when a voltage between the source and the drain is at 10 V is defined as a first threshold voltage ($V_{th1}$). Then, a stress test in which a negative voltage is applied to gate electrode 27 of the silicon carbide semiconductor device for a certain period of time is conducted. Thereafter, a drain current is measured with a gate voltage applied to the silicon carbide semiconductor device being varied and relation 3b between the gate voltage and the drain current is plotted. A gate voltage at which a drain current attains to 300 μA when a voltage between the source and the drain is at 10 V is defined as a second threshold voltage ($V_{th2}$). As shown in FIG. 16, the threshold voltage may fluctuate after the stress test. In particular, when the threshold voltage fluctuates toward a negative side, a switching operation which should be a normally off operation may be an on operation.

In MOSFET 1 according to the present embodiment, in a first stress test in which a gate voltage of −5 V is applied to gate electrode 27 for 100 hours at a temperature of 175° C., an absolute value of a difference between the first threshold voltage and the second threshold voltage (in other words, an amount of fluctuation in threshold voltage) is less than or equal to 0.5 V, preferably less than or equal to 0.3 V, and more preferably less than or equal to 0.1 V, with a threshold voltage before the first stress test being defined as the first threshold voltage and a threshold voltage after the first stress test being defined as the second threshold voltage. The second threshold voltage may be higher or lower than the first threshold voltage.

Preferably, in the first stress test in which a gate voltage of −5 V is applied to gate electrode 27 for 300 hours at a temperature of 175° C., an absolute value of a difference between the first threshold voltage and the second threshold voltage is less than or equal to 0.5 V, preferably less than or equal to 0.3 V, and more preferably less than or equal to 0.1 V, with a threshold voltage before the first stress test being defined as the first threshold voltage and a threshold voltage after the first stress test being defined as the second threshold voltage. The second threshold voltage may be higher or lower than the first threshold voltage.

Preferably, in the first stress test in which a negative bias of more than or equal to 5 V in absolute value is applied to gate electrode 27 for 300 hours at a temperature of 175° C., an absolute value of a difference between the first threshold voltage and the second threshold voltage is less than or equal to 0.5 V, preferably less than or equal to 0.3 V, and more preferably less than or equal to 0.1 V, with a threshold voltage before the first stress test being defined as the first threshold voltage and a threshold voltage after the first stress test being defined as the second threshold voltage. The second threshold voltage may be higher or lower than the first threshold voltage.

Preferably, in a second stress test in which a gate voltage of −10 V is applied to gate electrode 27 for 100 hours at a temperature of 150° C., an absolute value of a difference between a third threshold voltage and a fourth threshold voltage (in other words, an amount of fluctuation in threshold voltage) is less than or equal to 0.1 V, with a threshold voltage before the second stress test being defined as the third threshold voltage and a threshold voltage after the second stress test being defined as the fourth threshold voltage. The fourth threshold voltage may be higher or lower than the third threshold voltage.

Preferably, in the second stress test in which a gate voltage of −10 V is applied to gate electrode 27 for 300 hours at a temperature of 150° C., an absolute value of a difference between the third threshold voltage and the fourth threshold voltage is less than or equal to 0.1 V, with a threshold voltage before the second stress test being defined as the third threshold voltage and a threshold voltage after the second stress test being defined as the fourth threshold voltage. The fourth threshold voltage may be higher or lower than the third threshold voltage.

A method for manufacturing MOSFET 1 as the silicon carbide semiconductor device according to the first embodiment will now be described.

Figure 2:
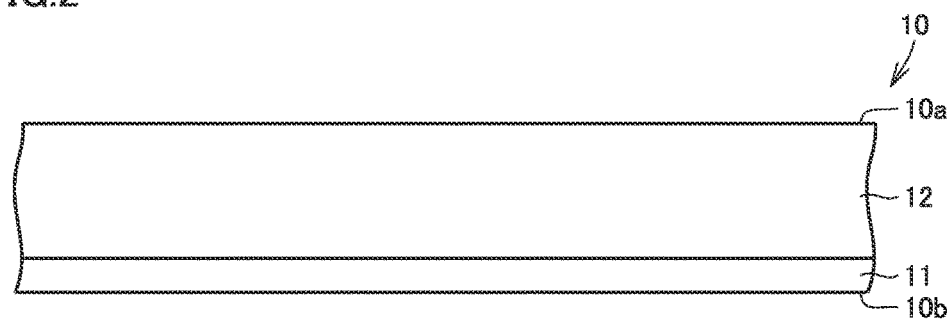
FIG. 2 is a schematic cross sectional view showing a first step of a method for manufacturing the silicon carbide semiconductor device according to the first embodiment.

First, a silicon carbide substrate preparing step is performed. Silicon carbide single crystal substrate 11 is prepared, for example, by slicing an ingot made of a hexagonal silicon carbide single crystal having a polytype of 4H formed by a sublimation method. Then, silicon carbide epitaxial layer 12 is formed on silicon carbide single crystal substrate 11, for example, by a chemical vapor deposition (CVD) method. Specifically, a carrier gas containing hydrogen ($H_2$) and a source gas containing monosilane ($SiH_4$), propane ($C_3H_8$), nitrogen ($N_2$), and the like are supplied over silicon carbide single crystal substrate 11, and silicon carbide single crystal substrate 11 is heated to, for example, more than or equal to about 1500° C. and less than or equal to about 1700° C. Thus, as shown in FIG. 2, silicon carbide epitaxial layer 12 is formed on silicon carbide single crystal substrate 11. Silicon carbide epitaxial layer 12 contains an n type impurity such as nitrogen, and has an n type conductivity type. As above, silicon carbide substrate 10 having first main surface 10a and second main surface 10b opposite to first main surface 10a is prepared. Silicon carbide substrate 10 includes silicon carbide single crystal substrate 11 forming second main surface 10b, and silicon carbide epitaxial layer 12 provided on silicon carbide single crystal substrate 11 and forming first main surface 10a.

Figure 3:
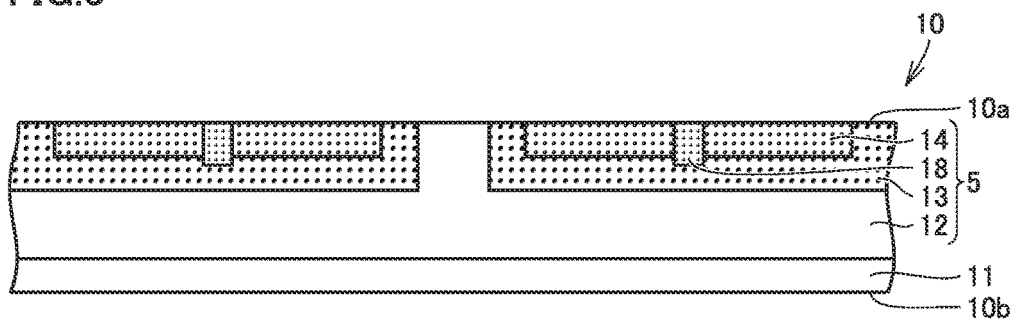
FIG. 3 is a schematic cross sectional view showing a second step of the method for manufacturing the silicon carbide semiconductor device according to the first embodiment.

Next, an ion implantation step is performed. Specifically, as shown in FIG. 3, ion implantation is performed on first main surface 10a of silicon carbide substrate 10. For example, aluminum (Al) ions are implanted into first main surface 10a of silicon carbide substrate 10, so that body region 13 having the p type conductivity type is formed in silicon carbide epitaxial layer 5. Then, for example, phosphorus (P) ions are implanted into body region 13 to a depth smaller than an implantation depth of Al ions, so that source region 14 having the n type conductivity type is formed. Then, for example, Al ions are further implanted into source region 14 and body region 13, so that contact region 18 which penetrates source region 14 and is in contact with body region 13, and has the p type conductivity type is formed. A region in silicon carbide epitaxial layer 5 where none of body region 13, source region 14, and contact region 18 is formed is defined as drift region 12. As above, body region 13, source region 14, and contact region 18 are formed on the first main surface 10a side of silicon carbide substrate 10.

Next, an activation annealing step is performed. Specifically, silicon carbide substrate 10 is heated at a temperature of more than or equal to 1600° C. and less than or equal to 2000° C., for about 30 minutes, for example. Thus, impurities in body region 13, source region 14, and contact region 18 formed in the ion implantation step are activated and desired carriers are generated.

Figure 4:
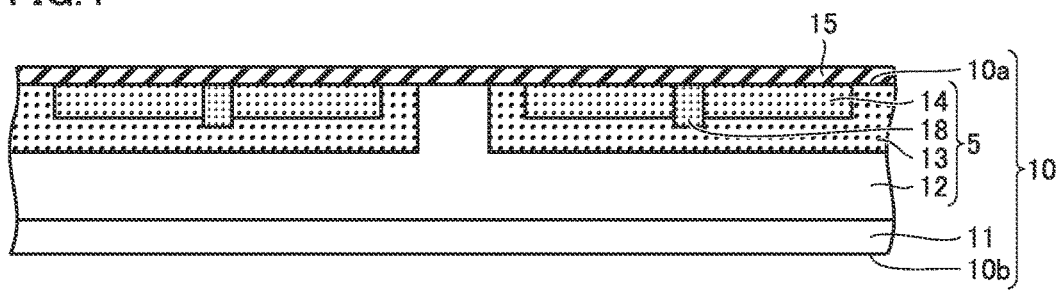
FIG. 4 is a schematic cross sectional view showing a third step of the method for manufacturing the silicon carbide semiconductor device according to the first embodiment.

Next, a gate insulating film forming step is performed. As shown in FIG. 4, for example, gate insulating film 15 made of silicon dioxide is formed to cover first main surface 10a of silicon carbide substrate 10, by heating silicon carbide substrate 10 in an atmosphere containing oxygen at a temperature of about 1350° C. for about 1 hour. Specifically, gate insulating film 15 is formed to be in contact with drift region 12, body region 13, source region 14, and contact region 18 at first main surface 10a.

Next, a nitridation annealing step is performed. Silicon carbide substrate 10 having gate insulating film 15 formed thereon is held in an atmospheric gas containing nitrogen such as nitrogen monoxide, nitrous oxide, nitrogen dioxide, or ammonia, for example, at a temperature of more than or equal to 1300° C. and less than or equal to 1500° C., for about 1 hour, for example. Thus, nitrogen atoms are captured in traps present in the vicinity of the interface between gate insulating film 15 and drift region 12. Consequently, formation of an interface state in the vicinity of the interface is suppressed.

Next, an Ar annealing step is performed. Specifically, silicon carbide substrate 10 having gate insulating film 15 formed thereon is held in an argon gas, at a temperature of more than or equal to 1100° C. and less than or equal to 1500° C., for about 1 hour, for example. Preferably, silicon carbide substrate 10 having gate insulating film 15 formed thereon is held at a temperature of more than or equal to 1300° C. and less than or equal to 1500° C. Thus, excessive carbon in the vicinity of the interface between silicon carbide substrate 10 and gate insulating film 15 can be reduced. Consequently, hole traps in the vicinity of the interface can be reduced.

Next, a gate electrode forming step is performed. Gate electrode 27 which is in contact with gate insulating film 15 and made of polysilicon containing an impurity is formed, for example, by a low pressure chemical vapor deposition (LPCVD) method. Gate electrode 27 is formed to face drift region 12, source region 14, and body region 13, with gate insulating film 15 being interposed therebetween.

Figure 5:
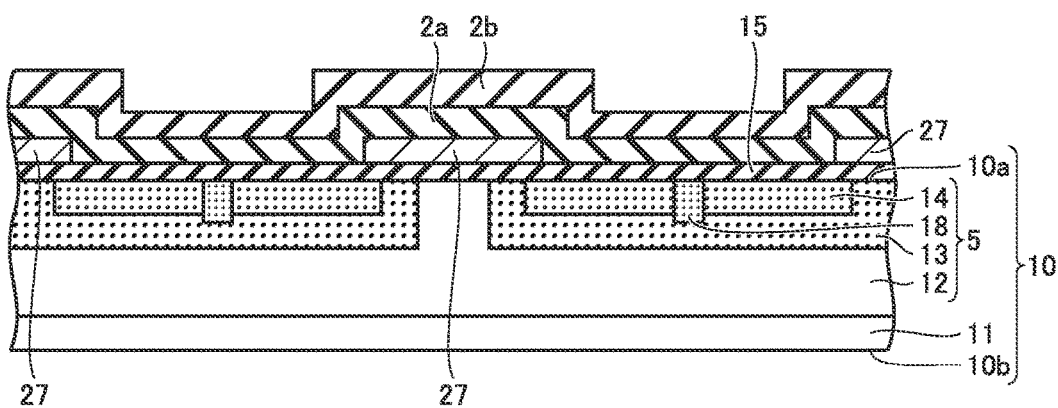
FIG. 5 is a schematic cross sectional view showing a fourth step of the method for manufacturing the silicon carbide semiconductor device according to the first embodiment.

Next, an interlayer insulating film forming step is performed. As shown in FIG. 5, first insulating film 2a which covers gate electrode 27 and is in contact with both gate electrode 27 and gate insulating film 15 is formed, for example, by the CVD method. First insulating film 2a contains silicon atoms, and contains neither phosphorus atoms nor boron atoms. Preferably, first insulating film 2a includes any of $SiO_2$, SiN, and SiON. Then, second insulating film 2b is formed on first insulating film 2a, for example, by the CVD method. First insulating film 2a and second insulating film 2b are formed at a temperature of more than or equal to 600° C. and less than or equal to 800° C., for example. Typically, first insulating film 2a and second insulating film 2b are formed at a temperature of 700° C. Second insulating film 2b contains silicon atoms and at least one of phosphorus atoms and boron atoms. That is, second insulating film 2b may contain silicon atoms and phosphorus atoms, may contain silicon atoms and boron atoms, or may contain silicon atoms, phosphorus atoms, and boron atoms. Preferably, second insulating film 2b includes any of PSG, BSG, and BPSG. After second insulating film 2b is formed, densification may be performed on second insulating film 2b. Densification of second insulating film 2b is performed at a temperature of more than or equal to 650° C. and less than or equal to 1100° C., for example. Typically, densification of second insulating film 2b is performed at a temperature of 900° C. for 30 minutes. By performing densification on second insulating film 2b, corners of the upper surface of second insulating film 2b can be rounded. It should be noted that densification of second insulating film 2b may be omitted. Immediately after second insulating film 2b is formed and before heat treatment is performed on second insulating film 2b, sodium atoms are not diffused inside second insulating film 2b. By performing heat treatment on second insulating film 2b, sodium atoms present outside second insulating film 2b are diffused inside second insulating film 2b.

Figure 6:
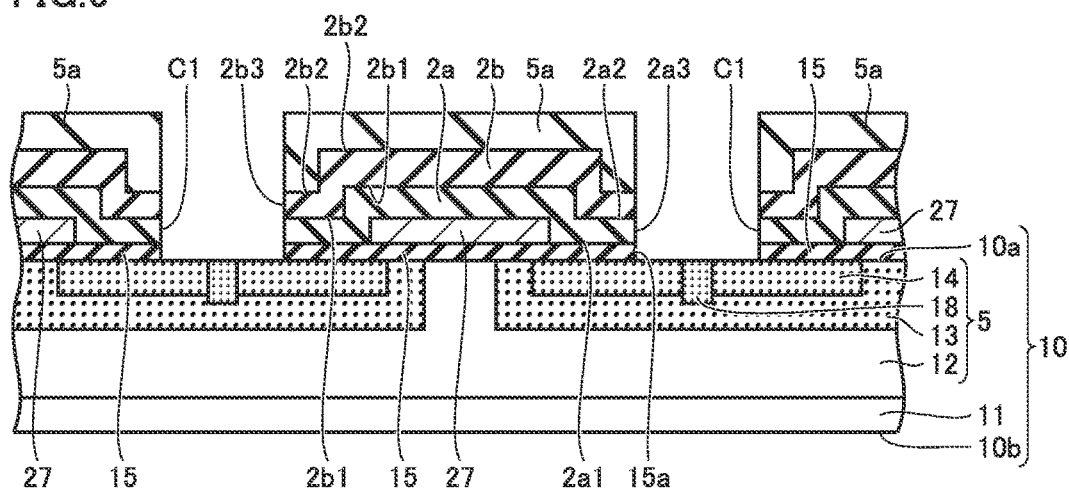
FIG. 6 is a schematic cross sectional view showing a fifth step of the method for manufacturing the silicon carbide semiconductor device according to the first embodiment.

Next, a first opening is formed. For example, an etching mask 5a is formed on second insulating film 2b. Etching mask 5a has an opening at a position facing source region 14 and contact region 18. Etching mask 5a is made of a resist, for example. Using etching mask 5a, portions of second insulating film 2b, first insulating film 2a, and gate insulating film 15 are removed to form a first opening C1 above first main surface 10a (see FIG. 6). Then, etching mask 5a is removed from above second insulating film 2b.

Figure 7:
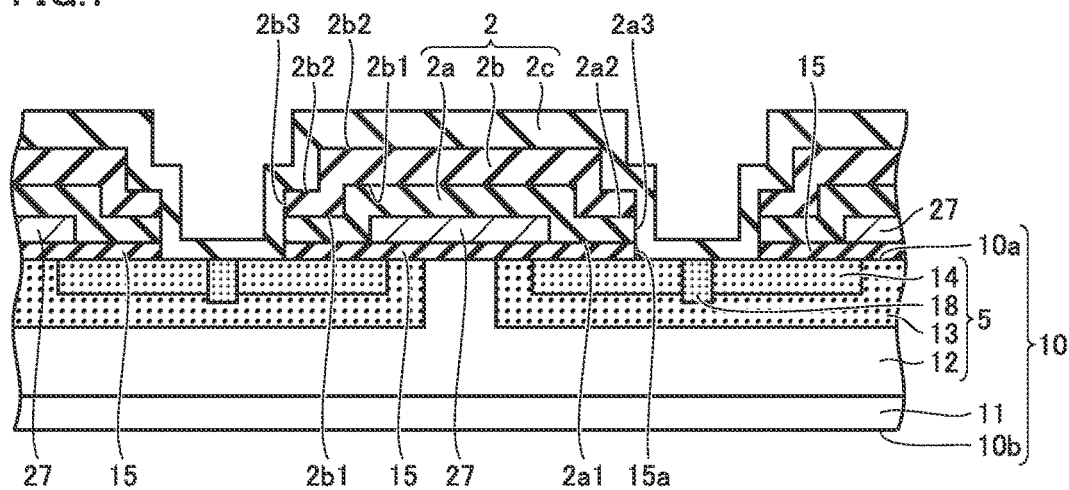
FIG. 7 is a schematic cross sectional view showing a sixth step of the method for manufacturing the silicon carbide semiconductor device according to the first embodiment.

Then, third insulating film 2c is formed, for example, by the CVD method. As shown in FIG. 7, third insulating film 2c is formed to be in contact with silicon carbide substrate 10, gate insulating film 15, first insulating film 2a, and second insulating film 2b. Third insulating film 2c is in contact with both source region 14 and contact region 18 at first main surface 10a of silicon carbide substrate 10. Third insulating film 2c is in contact with gate insulating film 15, first insulating film 2a, and second insulating film 2b, at first opening C1. Third insulating film 2c contains silicon atoms and contains neither phosphorus atoms nor boron atoms. Preferably, third insulating film 2c includes any of $SiO_2$, SiN, and SiON.

Figure 8:
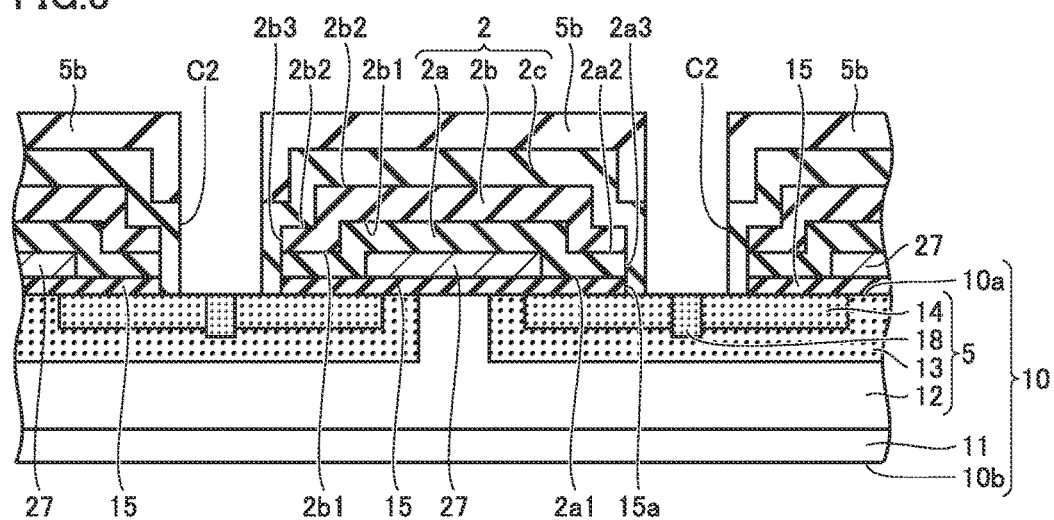
FIG. 8 is a schematic cross sectional view showing a seventh step of the method for manufacturing the silicon carbide semiconductor device according to the first embodiment.

Next, a second opening is formed. For example, an etching mask 5b is formed on third insulating film 2c. Etching mask 5b has an opening at a position facing source region 14 and contact region 18. Etching mask 5b is made of a resist, for example. Using etching mask 5b, a portion of third insulating film 2c is removed to form a second opening C2 above first main surface 10a (see FIG. 8). Then, etching mask 5b is removed from above third insulating film 2c. It should be noted that, as a method for forming second opening C2, a method other than that described above may be used, and it is also possible to form an opening without using etching mask 5b, by using an oxide film etching method which is highly anisotropic in a vertical direction.

Next, a barrier layer is formed. For example, a barrier layer which is in contact with an upper surface and a side surface of third insulating film 2c and first main surface 10a of silicon carbide substrate 10 is formed. Then, the barrier layer is etched along a direction perpendicular to first main surface 10a, and thus a portion of the barrier layer on third insulating film 2c and a portion of the barrier layer on first main surface 10a are removed. Thereby, barrier layer 17 which is in contact with the side surface of third insulating film 2c and first main surface 10a remains.

Figure 9:
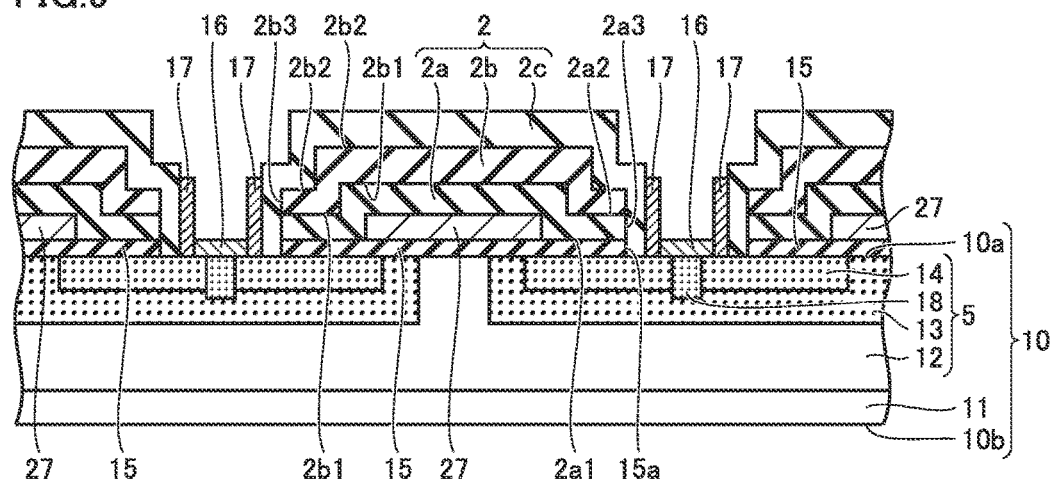
FIG. 9 is a schematic cross sectional view showing an eighth step of the method for manufacturing the silicon carbide semiconductor device according to the first embodiment.

Next, a source electrode forming step is performed. Source electrode 16 is formed to be in contact with both contact region 18 and source region 14 at first main surface 10a, for example by a sputtering method. Source electrode 16 is made of a material containing aluminum, for example. Preferably, source electrode 16 includes TiAlSi. As shown in FIG. 9, source electrode 16 is formed to be distant from third insulating film 2c by barrier layer 17. Next, alloying annealing is performed. Silicon carbide substrate 10 having source electrode 16 formed thereon is heated at a temperature of more than or equal to 900° C. and less than or equal to 1100° C., for about 15 minutes, for example. Typically, alloying annealing is performed at 1000° C. Thereby, at least a portion of source electrode 16 is silicided, and source electrode 16 in ohmic contact with source region 14 is formed. Preferably, source electrode 16 is also in ohmic contact with contact region 18.

Figure 10:
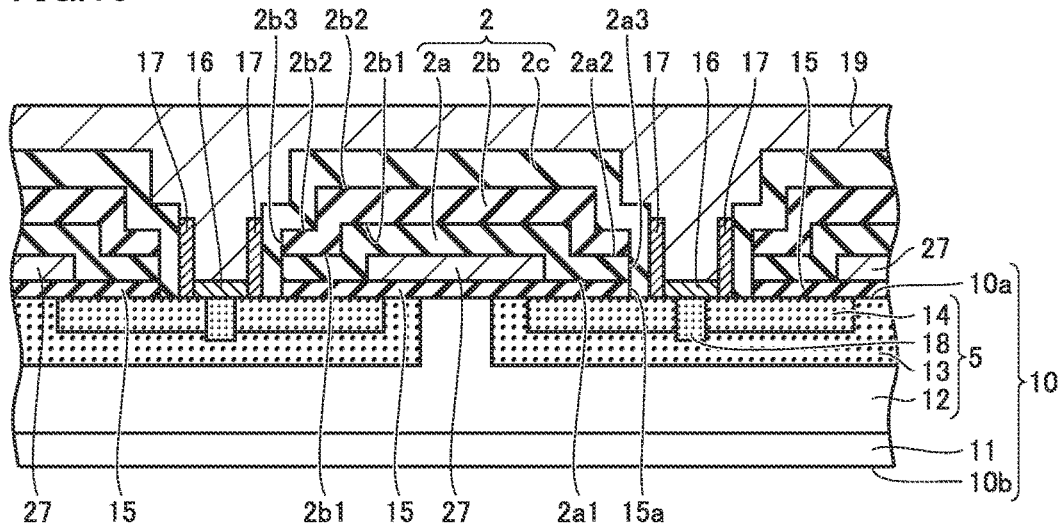
FIG. 10 is a schematic cross sectional view showing a ninth step of the method for manufacturing the silicon carbide semiconductor device according to the first embodiment.

Next, front surface protecting electrode 19 is formed to be in contact with source electrode 16. As shown in FIG. 10, front surface protecting electrode 19 is formed to cover third insulating film 2c. Front surface protecting electrode 19 is a wire containing aluminum. After front surface protecting electrode 19 is formed, sintering treatment is performed at a temperature of more than or equal to 300° C. and less than or equal to 500° C. Typically, sintering treatment is performed at 400° C. Next, drain electrode 20 is formed to be in contact with second main surface 10b of silicon carbide substrate 10. Drain electrode 20 is made of a material including NiSi, for example. Next, back surface protecting electrode 23 is formed to be in contact with drain electrode 20. As described above, MOSFET 1 according to the first embodiment is formed (see FIG. 1).

The function and effect of the MOSFET as the silicon carbide semiconductor device according to the first embodiment will now be described.

According to MOSFET 1 according to the first embodiment, interlayer insulating film 2 includes first insulating film 2a which is in contact with gate electrode 27, contains silicon atoms, and contains neither phosphorus atoms nor boron atoms, second insulating film 2b which is provided on first insulating film 2a and contains silicon atoms and at least one of phosphorus atoms and boron atoms, and third insulating film 2c which contains silicon atoms and contains neither phosphorus atoms nor boron atoms. Second insulating film 2b has first surface 2b1 which is in contact with first insulating film 2a, second surface 2b2 opposite to first surface 2b1, and third surface 2b3 which connects first surface 2b1 and second surface 2b2. Third insulating film 2c is in contact with at least one of second surface 2b2 and third surface 2b3. Thereby, fluctuation in the threshold voltage of silicon carbide semiconductor device 1 can be reduced. Further, an increase in the contact resistance between source electrode 16 and silicon carbide substrate 10 can be suppressed.

Further, according to MOSFET 1 according to the first embodiment, second insulating film 2b is confined within a space formed by first insulating film 2a and third insulating film 2c. Contamination of a contact hole by phosphorus atoms or boron atoms contained in second insulating film 2b can be suppressed. As a result, an increase in the contact resistance between source electrode 16 and silicon carbide substrate 10 can be effectively suppressed.

Further, according to MOSFET 1 according to the first embodiment, first insulating film 2a includes any of $SiO_2$, SiN, and SiON. Thereby, insulating property of interlayer insulating film 2 can be effectively improved.

Further, according to MOSFET 1 according to the first embodiment, second insulating film 2b includes any of PSG, BSG, and BPSG. Thereby, sodium can be effectively trapped by second insulating film 2b.

Further, according to MOSFET 1 according to the first embodiment, third insulating film 2c includes any of $SiO_2$, SiN, and SiON. Thereby, insulating property of interlayer insulating film 2 can be effectively improved.

Further, according to MOSFET 1 according to the first embodiment, the maximum value of the concentration of sodium atoms in gate insulating film 15 is less than or equal to $1 \times 10^{16}$ atoms/cm$^3$. Thereby, fluctuation in the threshold voltage of silicon carbide semiconductor device 1 can be effectively reduced.

Further, according to MOSFET 1 according to the first embodiment, the maximum value of the concentration of sodium atoms in second insulating film 2b is higher than the maximum value of the concentration of sodium atoms in first insulating film 2a. Diffusion of sodium into gate insulating film 15 can be suppressed by trapping a large amount of sodium atoms by second insulating film 2b.

Further, according to MOSFET 1 according to the first embodiment, the maximum value of the concentration of sodium atoms in second insulating film 2b is higher than the maximum value of the concentration of sodium atoms in gate insulating film 15. Diffusion of sodium into gate insulating film 15 can be suppressed by trapping a large amount of sodium atoms by second insulating film 2b.

Further, MOSFET 1 according to the first embodiment further includes source electrode 16 which is in contact with silicon carbide substrate 10 and contains aluminum, and barrier layer 17 provided between source electrode 16 and interlayer insulating film 2. Thereby, diffusion of aluminum contained in source electrode 16 into interlayer insulating film 2 can be suppressed.

Further, according to MOSFET 1 according to the first embodiment, barrier layer 17 includes TiN. Thereby, diffusion of aluminum contained in source electrode 16 into interlayer insulating film 2 can be effectively suppressed.

Further, according to MOSFET 1 according to the first embodiment, source electrode 16 includes TiAlSi. Thereby, a contact resistance between source electrode 16 and silicon carbide substrate 10 can be reduced.

Further, according to MOSFET 1 according to the first embodiment, in a first stress test in which a gate voltage of −5 V is applied to gate electrode 27 for 100 hours at a temperature of 175° C., an absolute value of a difference between a first threshold voltage and a second threshold voltage is less than or equal to 0.5 V, with a threshold voltage before the first stress test being defined as the first threshold voltage and a threshold voltage after the first stress test being defined as the second threshold voltage. Thereby, fluctuation in the threshold voltage of silicon carbide semiconductor device 1 can be effectively reduced.

Second Embodiment

A configuration of a MOSFET as a silicon carbide semiconductor device according to a second embodiment will now be described. MOSFET 1 according to the second embodiment is different from the MOSFET according to the first embodiment in that third insulating film 2c is not in contact with third surface 2b3 of second insulating film 2b. Other than that, the configuration of MOSFET 1 according to the second embodiment is substantially identical to that of the MOSFET according to the first embodiment. Accordingly, identical or corresponding parts will be designated by the same reference numerals, and the description thereof will not be repeated.

Figure 11:
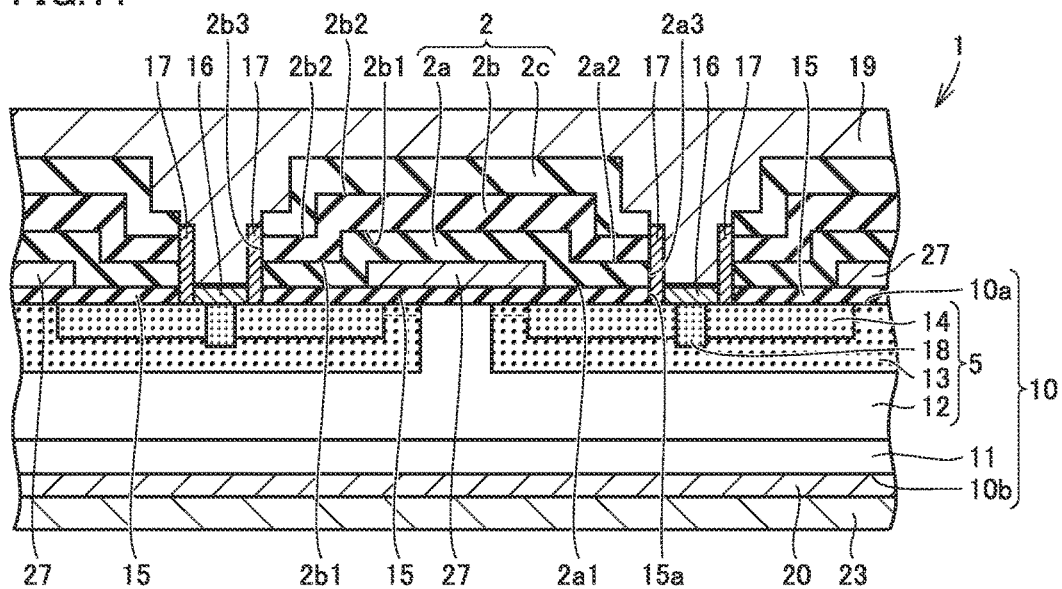
FIG. 11 is a schematic cross sectional view showing a structure of a silicon carbide semiconductor device according to a second embodiment.

As shown in FIG. 11, third insulating film 2c is in contact with second surface 2b2 of second insulating film 2b, and may not be in contact with third surface 2b3. That is, third insulating film 2c is provided only on the upper surface side of second insulating film 2b, and is not provided on the side surface side of second insulating film 2b. Barrier layer 17 is in contact with side surface 15a of gate insulating film 15, sixth surface 2a3 of first insulating film 2a, third surface 2b3 of second insulating film 2b, and the side surface of third insulating film 2c. Second insulating film 2b is surrounded by first insulating film 2a, third insulating film 2c, and barrier layer 17. Thereby, contamination of a contact hole by phosphorus or boron contained in second insulating film 2b is prevented.

According to MOSFET 1 according to the second embodiment, third insulating film 2c is in contact with second surface 2b2. Thereby, diffusion of sodium from the second surface 2b2 side toward gate insulating film 15 can be suppressed.

Third Embodiment

A configuration of a MOSFET as a silicon carbide semiconductor device according to a third embodiment will now be described. MOSFET 1 according to the third embodiment is different from the MOSFET according to the first embodiment in that third insulating film 2c is not in contact with second surface 2b2 of second insulating film 2b. Other than that, the configuration of MOSFET 1 according to the third embodiment is substantially identical to that of the MOSFET according to the first embodiment. Accordingly, identical or corresponding parts will be designated by the same reference numerals, and the description thereof will not be repeated.

Figure 12:
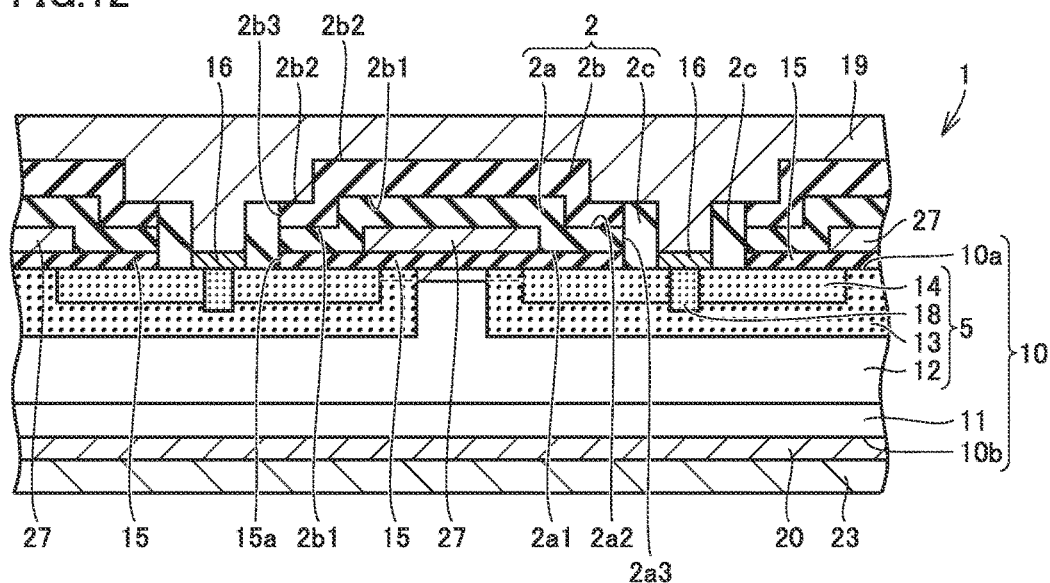
FIG. 12 is a schematic cross sectional view showing a structure of a silicon carbide semiconductor device according to a third embodiment.

As shown in FIG. 12, third insulating film 2c is in contact with third surface 2b3 of second insulating film 2b, and may not be in contact with second surface 2b2. That is, third insulating film 2c is provided only on the side surface side of second insulating film 2b, and is not provided on the upper surface side of second insulating film 2b. First insulating film 2a has fourth surface 2a1 which is in contact with gate insulating film 15, fifth surface 2a2 opposite to fourth surface 2a1, and sixth surface 2a3 which connects fourth surface 2a1 and fifth surface 2a2. Third insulating film 2c is in contact with third surface 2b3 of second insulating film 2b and sixth surface 2a3 of first insulating film 2a. Third insulating film 2c may be or may not be in contact with side surface 15a of gate insulating film 15. Front surface protecting electrode 19 is provided to be in contact with second surface 2b2 of second insulating film 2b. Barrier layer 17 may not be provided between third insulating film 2c and source electrode 16.

According to MOSFET 1 according to the third embodiment, first insulating film 2a has fourth surface 2a1 which is in contact with gate insulating film 15, fifth surface 2a2 opposite to fourth surface 2a1, and sixth surface 2a3 which connects fourth surface 2a1 and fifth surface 2a2. Third insulating film 2c is in contact with third surface 2b3 and sixth surface 2a3. Thereby, diffusion of sodium from the third surface 2b3 side and the sixth surface 2a3 side toward gate insulating film 15 can be suppressed.

Fourth Embodiment

A configuration of a MOSFET as a silicon carbide semiconductor device according to a fourth embodiment will now be described. MOSFET 1 according to the fourth embodiment is different from the MOSFET according to the first embodiment in that second insulating film 2b is in contact with first main surface 10a at third surface 2b3. Other than that, the configuration of MOSFET 1 according to the fourth embodiment is substantially identical to that of the MOSFET according to the first embodiment. Accordingly, identical or corresponding parts will be designated by the same reference numerals, and the description thereof will not be repeated.

Figure 13:
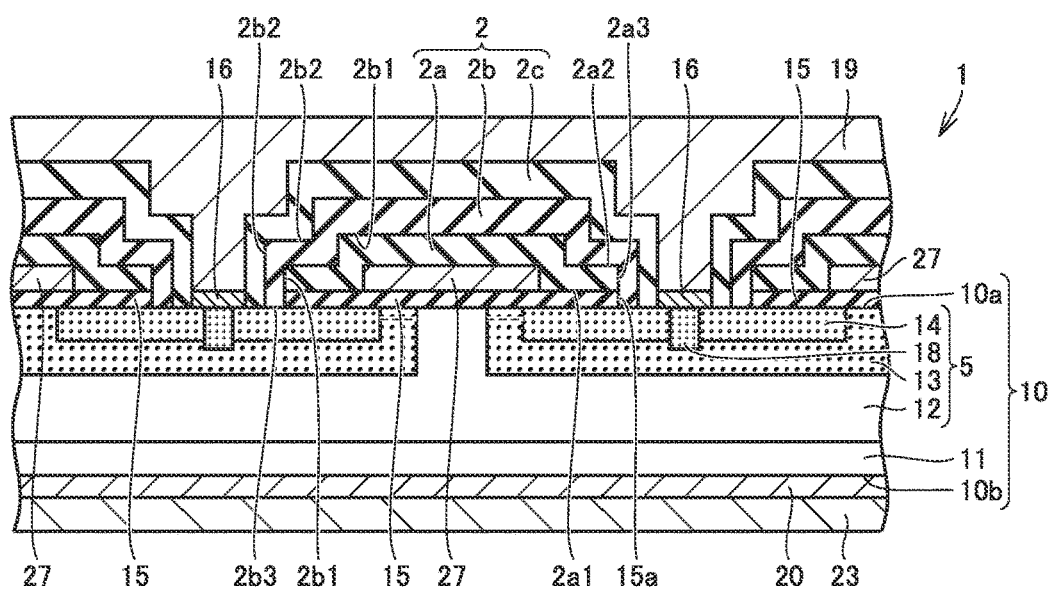
FIG. 13 is a schematic cross sectional view showing a structure of a silicon carbide semiconductor device according to a fourth embodiment.

As shown in FIG. 13, second insulating film 2b may be in contact with first main surface 10a at third surface 2b3. First surface 2b1 of second insulating film 2b is a surface which is in contact with first insulating film 2a and gate insulating film 15. Third surface 2b3 of second insulating film 2b is a surface which is in contact with third insulating film 2c. Third insulating film 2c is in contact with second surface 2b2, and is distant from first insulating film 2a by second insulating film 2b. Second insulating film 2b is in contact with source region 14 at first main surface 10a. Barrier layer 17 may not be provided between third insulating film 2c and source electrode 16. Second insulating film 2b is surrounded by first insulating film 2a, third insulating film 2c, and first main surface 10a.

According to MOSFET 1 according to the fourth embodiment, second insulating film 2b is in contact with main surface 10a at third surface 2b3. Third insulating film 2c is in contact with second surface 2b2, and is distant from first insulating film 2a by second insulating film 2b. Thereby, diffusion of sodium from the second surface 2b2 side toward gate insulating film 15 can be suppressed.

Fifth Embodiment

A configuration of a MOSFET as a silicon carbide semiconductor device according to a fifth embodiment will now be described. MOSFET 1 according to the fifth embodiment is different from the MOSFET according to the first embodiment in that interlayer insulating film 2 has a fourth insulating film 2d and a fifth insulating film 2e. Other than that, the configuration of MOSFET 1 according to the fifth embodiment is substantially identical to that of the MOSFET according to the first embodiment. Accordingly, identical or corresponding parts will be designated by the same reference numerals, and the description thereof will not be repeated.

Figure 14:
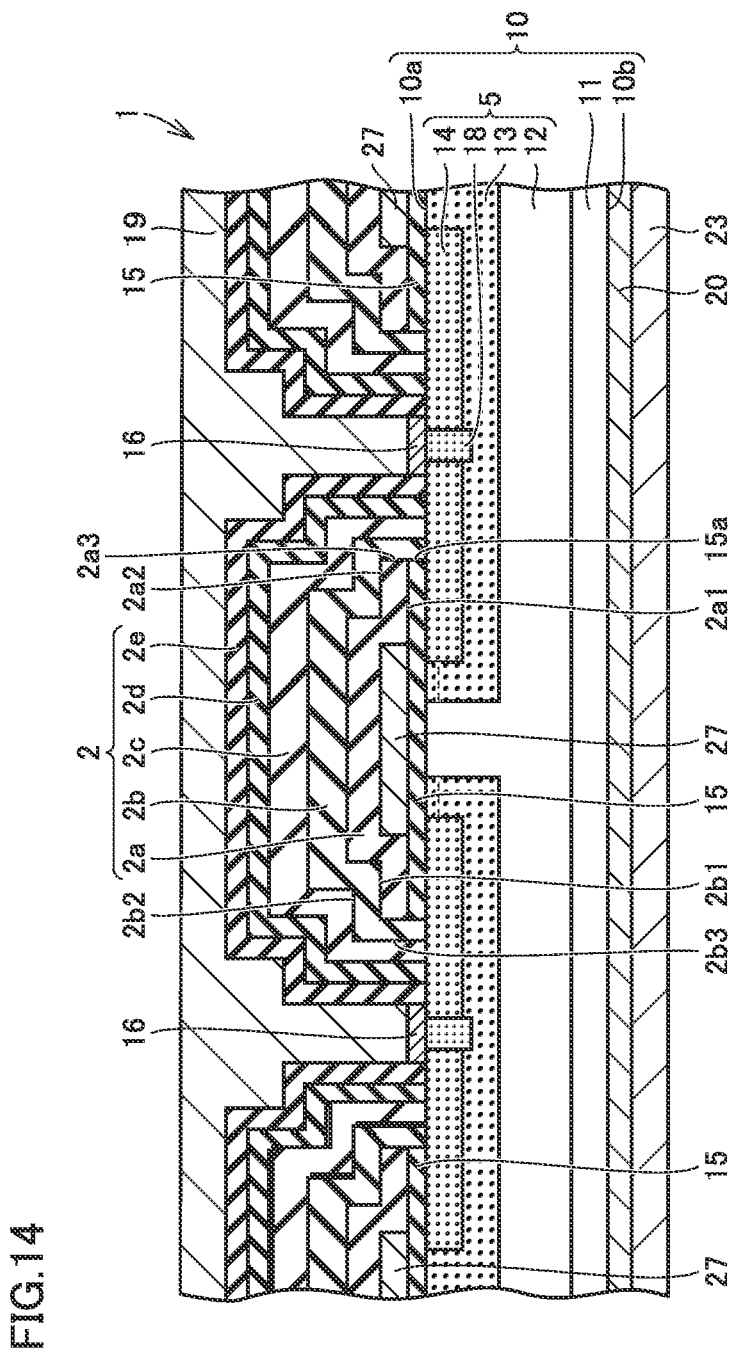
FIG. 14 is a schematic cross sectional view showing a structure of a silicon carbide semiconductor device according to a fifth embodiment.

As shown in FIG. 14, interlayer insulating film 2 may further have fourth insulating film 2d and fifth insulating film 2e. Fourth insulating film 2d contains silicon atoms and at least one of phosphorus atoms and boron atoms. Preferably, fourth insulating film 2d is made of the same material as that for second insulating film 2b. Fifth insulating film 2e contains silicon atoms and contains neither phosphorus atoms nor boron atoms. Preferably, fifth insulating film 2e is made of the same material as that for third insulating film 2c. Fourth insulating film 2d is in contact with both the upper surface and the side surface of third insulating film 2c. Fourth insulating film 2d may be in contact with source region 14 at first main surface 10a. Fifth insulating film 2e is in contact with both an upper surface and a side surface of fourth insulating film 2d. Fifth insulating film 2e may be in contact with source region 14 at first main surface 10a.

Figure 15:
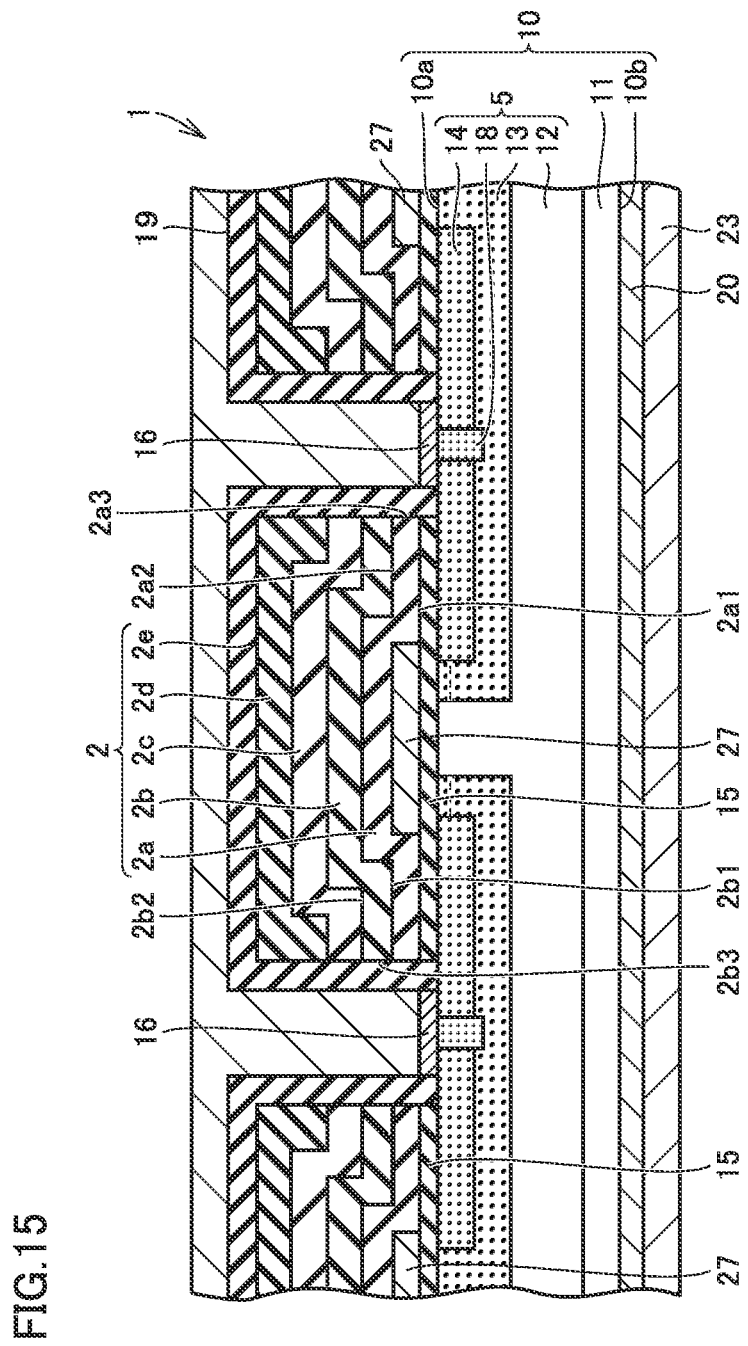
FIG. 15 is a schematic cross sectional view showing a structure of a variation of the silicon carbide semiconductor device according to the fifth embodiment.

As shown in FIG. 15, fourth insulating film 2d may be provided to be distant from second insulating film 2b by third insulating film 2c, and third insulating film 2c may be provided to be distant from first insulating film 2a by second insulating film 2b. Fifth insulating film 2e may be provided to entirely cover first insulating film 2a, second insulating film 2b, third insulating film 2c, and fourth insulating film 2d. Fifth insulating film 2e is in contact with side surface 2a3 of first insulating film 2a, side surface 2b3 of second insulating film 2b, the side surface of third insulating film 2c, and the side surface of fourth insulating film 2d. The material for third insulating film 2c may be the same as the material for first insulating film 2a, the material of fourth insulating film 2d may be the same as the material for second insulating film 2b, and the material for fifth insulating film 2e may be the same as the material for third insulating film 2c. That is, first insulating film 2a and second insulating film 2b may be repeatedly stacked alternately along the direction perpendicular to first main surface 10a of silicon carbide substrate 10, and third insulating film 2c may be finally provided to cover the stacked films. In a case where first insulating film 2a and second insulating film 2b are repeatedly stacked alternately as described above, different second insulating films 2b may be identical or different in material, composition, and thickness. For example, lower second insulating film 2b may be made of PSG, and the upper second insulating film (that is, fourth insulating film 2d) may be made of BPSG.

As described above, in interlayer insulating film 2, second insulating film 2b and third insulating film 2c may be repeatedly stacked, or first insulating film 2a and second insulating film 2b may be repeatedly stacked. Second insulating film 2b and third insulating film 2c may be repeatedly stacked along the direction perpendicular to first main surface 10a, or may be repeatedly stacked along a direction parallel to first main surface 10a. Similarly, first insulating film 2a and second insulating film 2b may be repeatedly stacked along the direction perpendicular to first main surface 10a, or may be repeatedly stacked along the direction parallel to first main surface 10a. Preferably, the number of repetition is two or more. Interlayer insulating film 2 may have a structure including five or more layers.

According to MOSFET 1 according to the fifth embodiment, first insulating film 2a and second insulating film 2b are repeatedly stacked in interlayer insulating film 2.

Thereby, diffusion of sodium into gate insulating film 15 can be effectively suppressed. As a result, fluctuation in the threshold voltage of silicon carbide semiconductor device 1 can be effectively reduced.

It should be noted that, although it has been described in each of the above embodiments that the first conductivity type is an n type and the second conductivity type is a p type, the first conductivity type may be a p type and the second conductivity type may be an n type. Further, although it has been described above that the silicon carbide semiconductor device is a MOSFET, the silicon carbide semiconductor device may be, for example, an insulated gate bipolar transistor (IGBT) or the like. Furthermore, although it has been described above that the silicon carbide semiconductor device is of a planar type, the silicon carbide semiconductor device may be of a trench type.

Example

Figure 17:
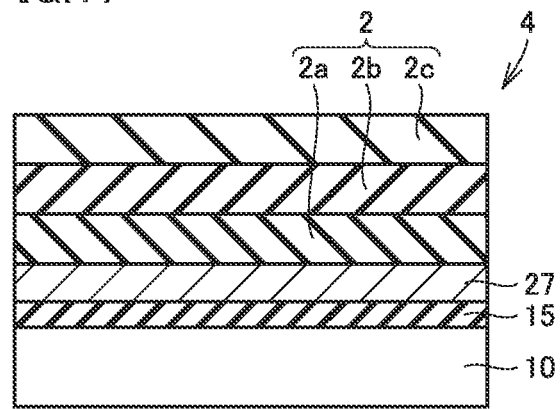
FIG. 17 is a schematic cross sectional view showing a structure of a MOS capacitor according to an Example.

First, a MOS capacitor according to an Example (see FIG. 17) is fabricated. As shown in FIG. 17, gate oxide film 15 is formed by thermally oxidizing first main surface 10a of silicon carbide substrate 10. Gate oxide film 15 has a thickness of 50 nm. Gate electrode 27 made of polysilicon is formed on gate oxide film 15. Gate electrode 27 has a thickness of 300 nm. First insulating film 2a made of silicon dioxide is formed on gate electrode 27. First insulating film 2a has a thickness of 250 nm. Second insulating film 2b made of PSG is formed on first insulating film 2a. PSG has a thickness of 250 nm. Third insulating film 2c made of silicon dioxide is formed on second insulating film 2b. Third insulating film 2c has a thickness of 300 nm.

Figure 18:
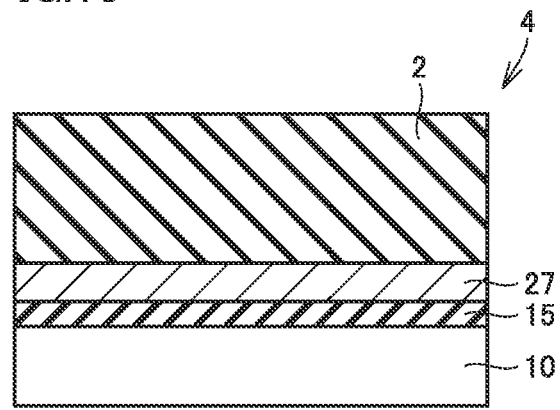
FIG. 18 is a schematic cross sectional view showing a structure of a MOS capacitor according to a Comparative Example.

Next, a MOS capacitor according to a Comparative Example (see FIG. 18) is fabricated. As shown in FIG. 18, gate oxide film 15 is formed by thermally oxidizing first main surface 10a of silicon carbide substrate 10. Gate oxide film 15 has a thickness of 50 nm. Gate electrode 27 made of polysilicon is formed on gate oxide film 15. Gate electrode 27 has a thickness of 300 nm. Interlayer insulating film 2 made of silicon dioxide is formed on gate electrode 27. Interlayer insulating film 2 has a thickness of 900 nm.

Next, annealing is performed on both the MOS capacitor according to the Example and the MOS capacitor according to the Comparative Example, under a nitrogen atmosphere. Specifically, each MOS capacitor is annealed for 45 minutes under a condition at 400° C. It should be noted that the condition for this annealing corresponds to a relatively moderate condition in the conditions for a sintering treatment step in the step of forming the back surface protecting electrode or the heat treatment steps performed after forming gate oxide film 15 described in the above embodiments. By this annealing, Na adhering on interlayer insulating film 2 during wafer fabrication and in storage environment or until completion of a previous step is diffused toward gate insulating film 15.

Figure 19:
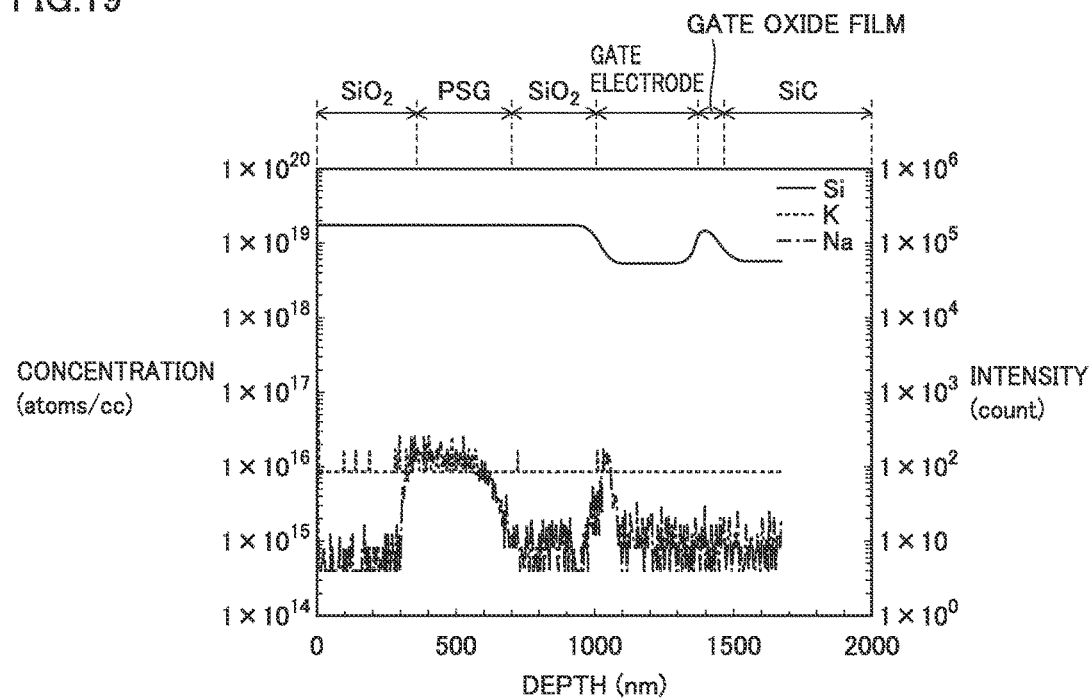
FIG. 19 is a view showing the relation between an element concentration and a depth from a surface in the MOS capacitor according to the Example.
Figure 20:
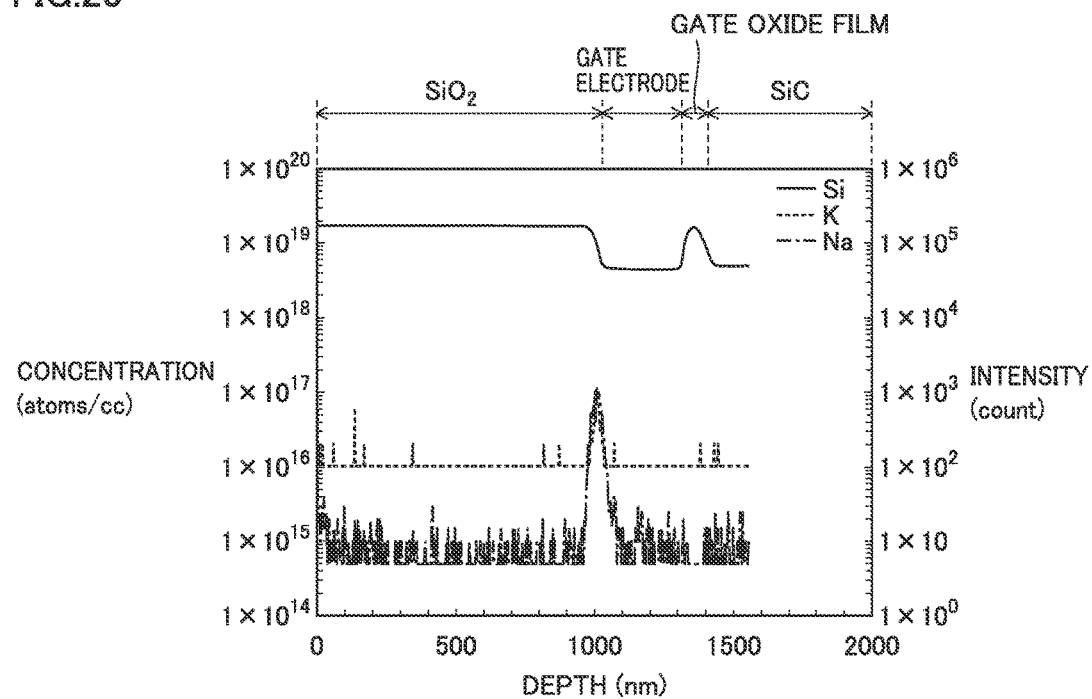
FIG. 20 is a view showing the relation between an element concentration and a depth from a surface in the MOS capacitor according to the Comparative Example.

Concentrations and intensities of Na atoms, potassium atoms, and silicon atoms contained in the materials for the MOS capacitor according to each of the Example and the Comparative Example are measured with SIMS. FIG. 19 and FIG. 20 show measurement results of the MOSFETs according to the Example and the Comparative Example, respectively. In FIG. 19 and FIG. 20, the axis of abscissas represents a depth (nm) from an upper surface of interlayer insulating film 2. The axis of ordinates on the left side represents concentrations of respective atoms. The axis of ordinates on the right side represents intensities of respective atoms. On the upper side of each drawing, positions of the materials constituting the MOS capacitor are indicated.

As shown in FIG. 20, the maximum value of the concentration of Na atoms in gate electrode 27 of the MOS capacitor according to the Comparative Example is about $1\times10^{17}$ atoms/cc. The maximum value of the concentration of K atoms in gate electrode 27 of the MOS capacitor according to the Comparative Example is about $1\times10^{17}$ atoms/cc.

As shown in FIG. 19, the maximum value of the concentration of Na atoms in gate electrode 27 of the MOS capacitor according to the Example is more than or equal to about $1\times10^{16}$ atoms/cc and less than or equal to about $2\times10^{16}$ atoms/cc. The maximum value of the concentration of K atoms in gate electrode 27 of the MOS capacitor according to the Example is more than or equal to about $1\times10^{16}$ atoms/cc and less than or equal to about $2\times10^{16}$ atoms/cc. On the other hand, the maximum value of the concentration of Na atoms in second insulating film 2b (PSG) of the MOS capacitor according to the Example is more than or equal to about $1\times10^{16}$ atoms/cc and less than or equal to about $2\times10^{16}$ atoms/cc. The maximum value of the concentration of K atoms in second insulating film 2b (PSG) of the MOS capacitor according to the Example is more than or equal to about $2\times10^{16}$ atoms/cc and less than or equal to about $3\times10^{16}$ atoms/cc.

That is, the concentrations of Na atoms and K atoms in gate electrode 27 are reduced by forming interlayer insulating film 2 including second insulating film 2b made of PSG on gate electrode 27. Further, as shown in FIG. 19, both Na atoms and K atoms are trapped in second insulating film 2b made of PSG.

Next, additional heat treatment is performed on the MOS capacitor according to each of the Example the Comparative Example, at a temperature of 1000° C. for 15 minutes. The condition for the additional heat treatment corresponds to the condition for the alloying annealing of the source electrode described in the above embodiments. After the additional heat treatment is performed, concentrations of Na atoms contained in the materials for the MOS capacitor according to each of the Example and the Comparative Example are measured with SIMS.

As a result of the measurement with SIMS, the maximum values of the concentrations of Na atoms contained in interlayer insulating film 2 and gate insulating film 15 of the MOS capacitor according to the Comparative Example are about $1\times10^{15}$ atoms/cc and about $1\times10^{17}$ atoms/cc, respectively. Further, the maximum values of the concentrations of K atoms thereof are less than $1\times10^{16}$ atoms/cc and about $5\times10^{16}$ atoms/cc, respectively. In contrast, the maximum values of the concentrations of Na atoms contained in second insulating film 2b, first insulating film 2a, and gate insulating film 15 of the MOS capacitor according to the Example are about $3\times10^{16}$ atoms/cc, about $5\times10^{15}$ atoms/cc, and about $1\times10^{15}$ atoms/cc, respectively. Further, the maximum values of the concentrations of K atoms thereof are about $4\times10^{16}$ atoms/cc, about $2\times10^{16}$ atoms/cc, and less than $1\times10^{16}$ atoms/cc, respectively. That is, in the case of the MOS capacitor according to the Comparative Example without having second insulating film 2b made of PSG, large amounts of Na atoms and K atoms are diffused into gate insulating film 15. In contrast, in the case of the MOS capacitor according to the Example having second insulating film 2b made of PSG, Na atoms are trapped in second insulating film 2b made of PSG, and thus the concentration of Na atoms in gate insulating film 15 can be maintained low.

It should be understood that the embodiments and the example disclosed herein are illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

1: silicon carbide semiconductor device (MOSFET); 2: interlayer insulating film; 2a: first insulating film; 2a1: fourth surface; 2a2: fifth surface; 2a3: sixth surface; 2b: second insulating film; 2b1: first surface; 2b2: second surface; 2b3: third surface; 2c: third insulating film; 2d: fourth insulating film; 2e: fifth insulating film; 5: silicon carbide epitaxial layer; 5a, 5b: etching mask; 10: silicon carbide substrate; 10a: first main surface (main surface); 10b: second main surface; 11: silicon carbide single crystal substrate; 12: drift region (silicon carbide epitaxial layer); 13: body region; 14: source region; 15: gate insulating film (gate oxide film); 15a: side surface; 16: source electrode; 17: barrier layer; 18: contact region; 19: front surface protecting electrode; 20: drain electrode; 23: back surface protecting electrode; 27: gate electrode; C1: first opening; C2: second opening; CH: channel region.

The invention claimed is:
1. A silicon carbide semiconductor device, comprising:
a silicon carbide substrate having a main surface;
a gate insulating film provided on the main surface of the silicon carbide substrate;
a gate electrode provided on the gate insulating film; and
an interlayer insulating film provided to cover the gate electrode,
the interlayer insulating film including
a first insulating film which is in contact with the gate electrode, contains silicon atoms, and contains neither phosphorus atoms nor boron atoms,
a second insulating film which is provided on the first insulating film and contains silicon atoms and at least one of phosphorus atoms and boron atoms, and
a third insulating film which contains silicon atoms and contains neither phosphorus atoms nor boron atoms,
the second insulating film having a first surface which is in contact with the first insulating film, a second surface opposite to the first surface, and a third surface which connects the first surface and the second surface,
the third insulating film being in contact with at least one of the second surface and the third surface; wherein
the first insulating film has a fourth surface which is in contact with the gate insulating film, a fifth surface opposite to the fourth surface, and a sixth surface which connects the fourth surface and the fifth surface, and
the third insulating film is in contact with the third surface and the sixth surface.
2. The silicon carbide semiconductor device according to claim 1, wherein the second insulating film is confined within a space formed by the first insulating film and the third insulating film.
3. The silicon carbide semiconductor device according to claim 1, wherein the third insulating film is in contact with the second surface.
4. The silicon carbide semiconductor device according to claim 1, wherein
the second insulating film is in contact with the main surface at the third surface, and
the third insulating film is in contact with the second surface, and is distant from the first insulating film by the second insulating film.
5. The silicon carbide semiconductor device according to claim 1, wherein the first insulating film includes any of $SiO_2$, SiN, and SiON.
6. The silicon carbide semiconductor device according to claim 1, wherein the second insulating film includes any of PSG, BSG, and BPSG.
7. The silicon carbide semiconductor device according to claim 1, wherein the third insulating film includes any of $SiO_2$, SiN, and SiON.
8. The silicon carbide semiconductor device according to claim 1, wherein a maximum value of a concentration of sodium atoms in the gate insulating film is less than or equal to $1\times10^{16}$ atoms/cm$^3$.
9. The silicon carbide semiconductor device according to claim 1, further comprising:
a source electrode which is in contact with the silicon carbide substrate and contains aluminum, and
a barrier layer provided between the source electrode and the interlayer insulating film.
10. The silicon carbide semiconductor device according to claim 9, wherein the barrier layer includes TiN.
11. The silicon carbide semiconductor device according to claim 9, wherein the source electrode includes TiAlSi.
12. The silicon carbide semiconductor device according to claim 1, wherein the first insulating film and the second insulating film are repeatedly stacked in the interlayer insulating film.
13. A silicon carbide semiconductor device, comprising:
a silicon carbide substrate having a main surface;
a gate insulating film provided on the main surface of the silicon carbide substrate;
a gate electrode provided on the gate insulating film; and
an interlayer insulating film provided to cover the gate electrode,
the interlayer insulating film including
a first insulating film which is in contact with the gate electrode, contains silicon atoms, and contains neither phosphorus atoms nor boron atoms,
a second insulating film which is provided on the first insulating film and contains silicon atoms and at least one of phosphorus atoms and boron atoms, and
a third insulating film which contains silicon atoms and contains neither phosphorus atoms nor boron atoms,
the second insulating film having a first surface which is in contact with the first insulating film, a second surface opposite to the first surface, and a third surface which connects the first surface and the second surface,
the third insulating film being in contact with at least one of the second surface and the third surface; wherein
a maximum value of a concentration of sodium atoms in the second insulating film is higher than a maximum value of a concentration of sodium atoms in the first insulating film.
14. A silicon carbide semiconductor device, comprising:
a silicon carbide substrate having a main surface;
a gate insulating film provided on the main surface of the silicon carbide substrate;
a gate electrode provided on the gate insulating film; and
an interlayer insulating film provided to cover the gate electrode,
the interlayer insulating film including
a first insulating film which is in contact with the gate electrode, contains silicon atoms, and contains neither phosphorus atoms nor boron atoms, a second insulating film which is provided on the first insulating film and contains silicon atoms and at least one of phosphorus atoms and boron atoms, and a third insulating film which contains silicon atoms and contains neither phosphorus atoms nor boron atoms, the second insulating film having a first surface which is in contact with the first insulating film, a second surface opposite to the first surface, and a third surface which connects the first surface and the second surface, the third insulating film being in contact with at least one of the second surface and the third surface; wherein a maximum value of a concentration of sodium atoms in the second insulating film is higher than a maximum value of a concentration of sodium atoms in the gate insulating film.

15. A silicon carbide semiconductor device, comprising:

a silicon carbide substrate having a main surface;

a gate insulating film provided on the main surface of the silicon carbide substrate;

a gate electrode provided on the gate insulating film; and an interlayer insulating film provided to cover the gate electrode, the interlayer insulating film including a first insulating film which is in contact with the gate electrode, contains silicon atoms, and contains neither phosphorus atoms nor boron atoms, a second insulating film which is provided on the first insulating film and contains silicon atoms and at least one of phosphorus atoms and boron atoms, and a third insulating film which contains silicon atoms and contains neither phosphorus atoms nor boron atoms, the second insulating film having a first surface which is in contact with the first insulating film, a second surface opposite to the first surface, and a third surface which connects the first surface and the second surface, the third insulating film being in contact with at least one of the second surface and the third surface; wherein, in a first stress test in which a gate voltage of −5 V is applied to the gate electrode for 100 hours at a temperature of 175° C., an absolute value of a difference between a first threshold voltage and a second threshold voltage is less than or equal to 0.5 V, with a threshold voltage before the first stress test being defined as the first threshold voltage and a threshold voltage after the first stress test being defined as the second threshold voltage.

* * * * *

UNITED STATES PATENT AND TRADEMARK OFFICE
CERTIFICATE OF CORRECTION

PATENT NO. : 10,014,258 B2
APPLICATION NO. : 15/512916
DATED : July 3, 2018
INVENTOR(S) : Shunsuke Yamada et al.

It is certified that error appears in the above-identified patent and that said Letters Patent is hereby corrected as shown below:

On the Title Page

At item (71) Applicant:
"Renesas Electronics Corporation, Koutou-ku (JP)"
Should read:
-- Renesas Electronics Corporation, Tokyo (JP) --

Signed and Sealed this
Fourteenth Day of May, 2019

Andrei Iancu
*Director of the United States Patent and Trademark Office*